(12) United States Patent
Nishimura et al.

(10) Patent No.: US 9,111,858 B2
(45) Date of Patent: Aug. 18, 2015

(54) NON-VOLATILE SEMICONDUCTOR MEMORY DEVICE AND METHOD FOR MANUFACTURING THE SAME

(71) Applicant: KABUSHIKI KAISHA TOSHIBA, Tokyo (JP)

(72) Inventors: Jun Nishimura, Kuwana (JP); Nobuaki Yasutake, Yokkaichi (JP); Kei Sakamoto, Nagoya (JP); Takayuki Okamura, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 47 days.

(21) Appl. No.: 13/838,722

(22) Filed: Mar. 15, 2013

(65) Prior Publication Data

US 2013/0277640 A1    Oct. 24, 2013

(30) Foreign Application Priority Data

Mar. 23, 2012  (JP) ................. 2012-068423

(51) Int. Cl.
*H01L 21/336*  (2006.01)
*H01L 27/24*  (2006.01)
*H01L 45/00*  (2006.01)

(52) U.S. Cl.
CPC ........ *H01L 27/2481* (2013.01); *H01L 27/2409* (2013.01); *H01L 45/04* (2013.01); *H01L 45/1233* (2013.01); *H01L 45/146* (2013.01); *H01L 45/1641* (2013.01); *H01L 45/1675* (2013.01)

(58) Field of Classification Search
CPC .................................................... H01L 27/2481
USPC ............................................................. 257/5
See application file for complete search history.

(56) References Cited

U.S. PATENT DOCUMENTS

| | | |
|---|---|---|
| 2009/0121208 A1 | 5/2009 | Nagashima et al. |
| 2010/0243981 A1 | 9/2010 | Kang et al. |
| 2010/0302842 A1 | 12/2010 | Kawagoe et al. |
| 2011/0147691 A1 | 6/2011 | Yasutake |
| 2011/0233500 A1* | 9/2011 | Nishimura et al. ............... 257/2 |
| 2013/0250654 A1* | 9/2013 | Sugimae et al. .............. 365/148 |
| 2014/0003127 A1 | 1/2014 | Sakamoto et al. |

FOREIGN PATENT DOCUMENTS

| | | |
|---|---|---|
| JP | 2010-282989 | 12/2010 |
| JP | 2011-9485 | 1/2011 |
| JP | 2011-71380 | 4/2011 |
| JP | 2011-129705 | 6/2011 |
| JP | 2011-199197 | 10/2011 |
| JP | 2014-11391 | 1/2014 |

* cited by examiner

*Primary Examiner* — Roy Potter
*Assistant Examiner* — Damian A Hillman
(74) *Attorney, Agent, or Firm* — Oblon, McClelland, Maier & Neustadt, L.L.P.

(57) ABSTRACT

A non-volatile semiconductor memory device includes a cell array layer including a first wire, one or more memory cells stacked on the first wire, and a second wire formed on the memory cell so as to cross the first wire, wherein the memory cell includes a current rectifying element and a variable resistance element, and an atomic composition ratio of nitrogen is higher than that of oxygen in a part of a sidewall of the current rectifying element.

13 Claims, 37 Drawing Sheets

B - B' CROSS SECTION

C - C' CROSS SECTION

B - B' CROSS SECTION

C - C' CROSS SECTION

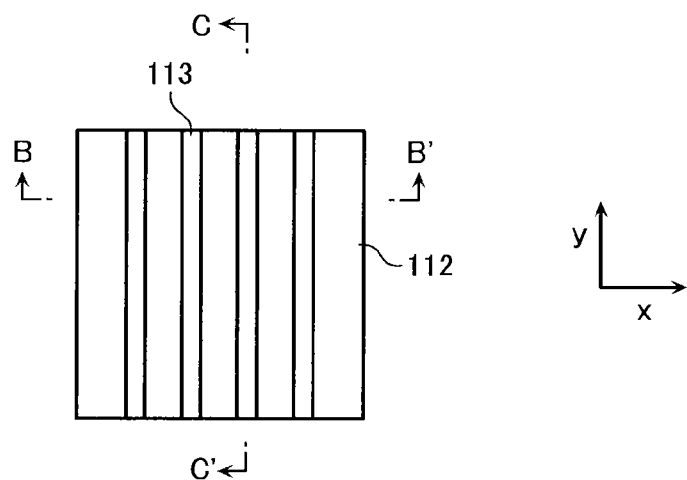
FIG. 10A
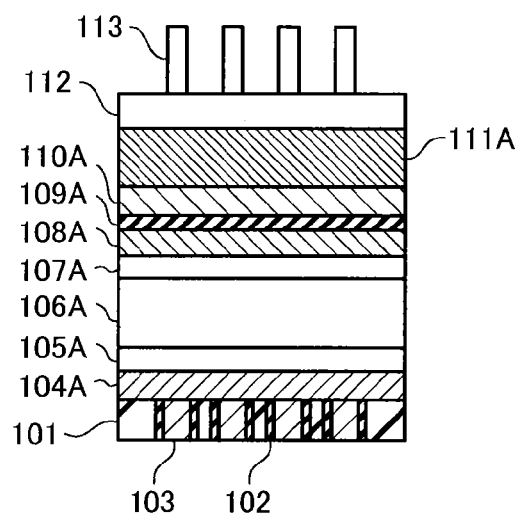
B – B' CROSS SECTION
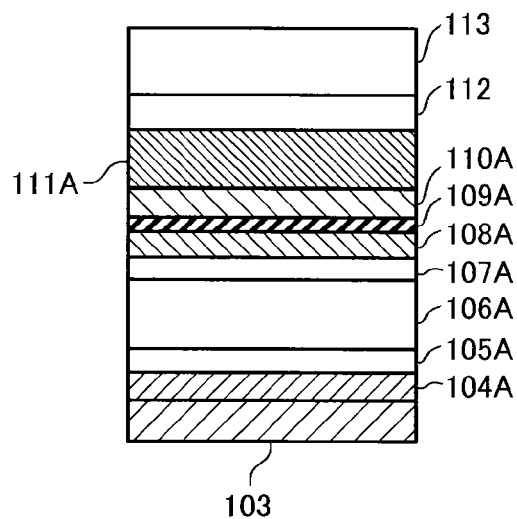
C – C' CROSS SECTION

B - B' CROSS SECTION

C - C' CROSS SECTION

B - B' CROSS SECTION

C - C' CROSS SECTION

B - B' CROSS SECTION

C - C' CROSS SECTION

B - B' CROSS SECTION

C - C' CROSS SECTION

B – B' CROSS SECTION

C – C' CROSS SECTION

B - B' CROSS SECTION

C - C' CROSS SECTION

FIG. 17A
FIG. 17B
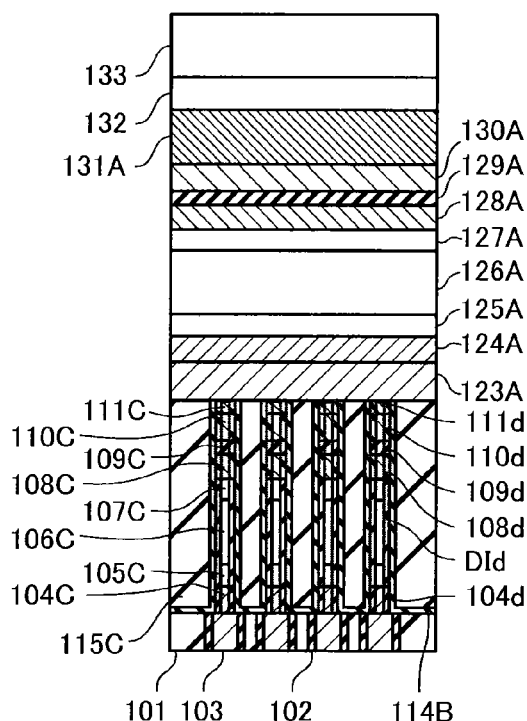
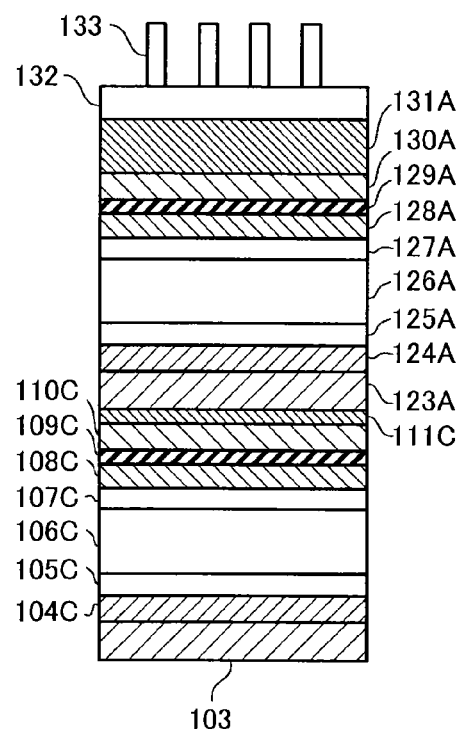
FIG. 18A
FIG. 18B
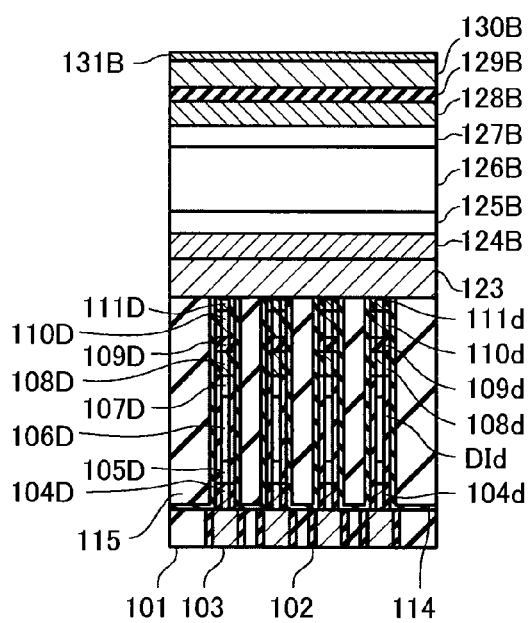
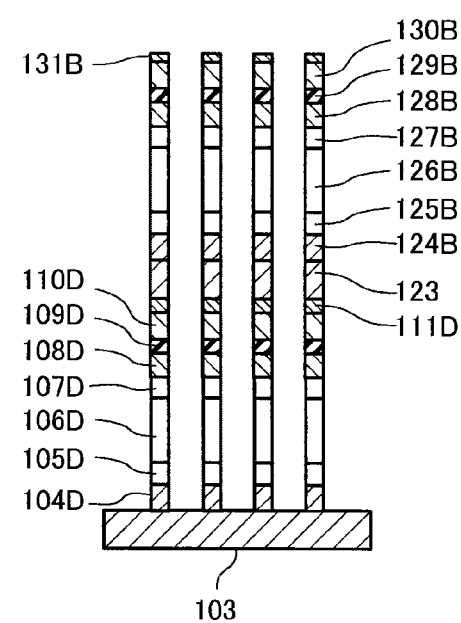

FIG. 24A
FIG. 24B
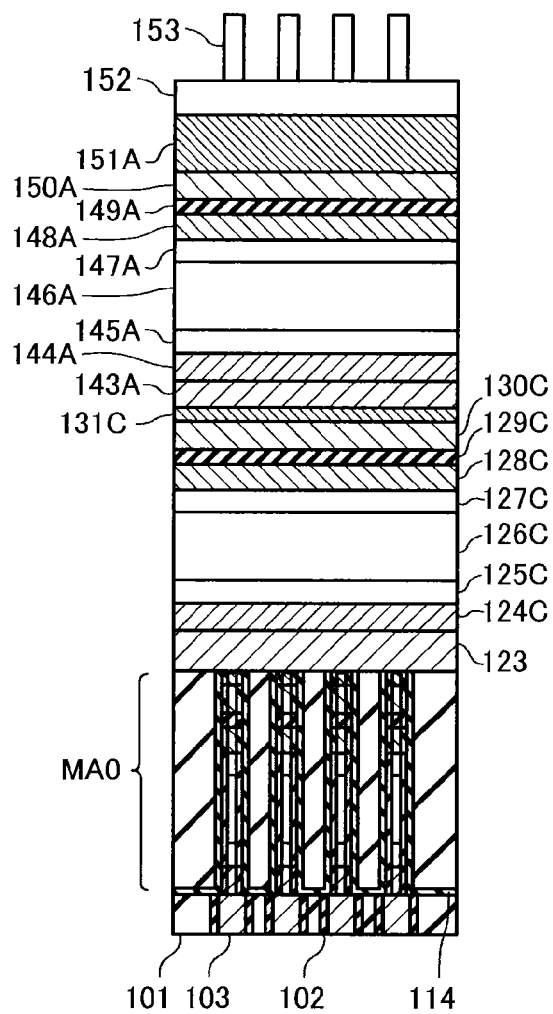
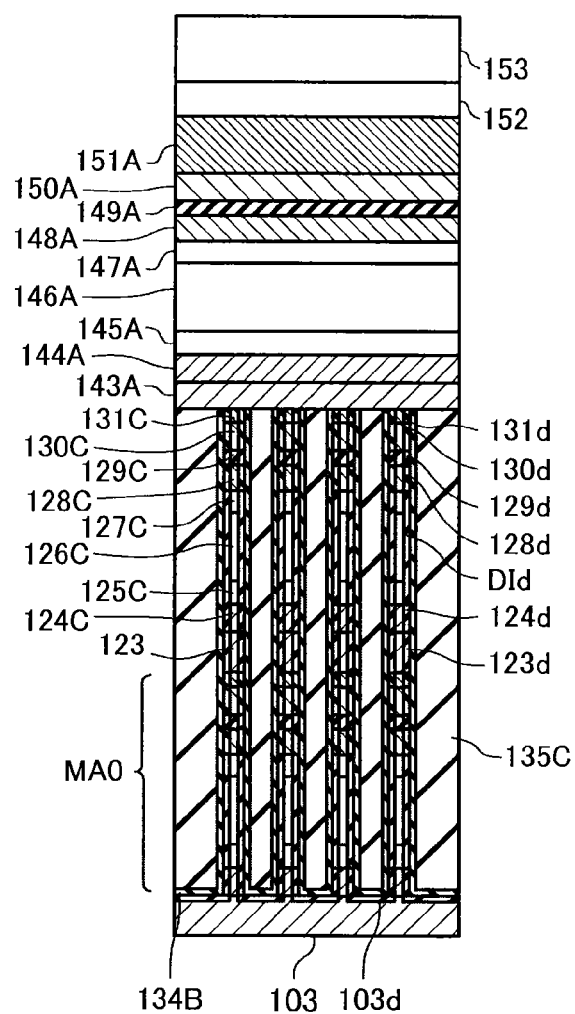

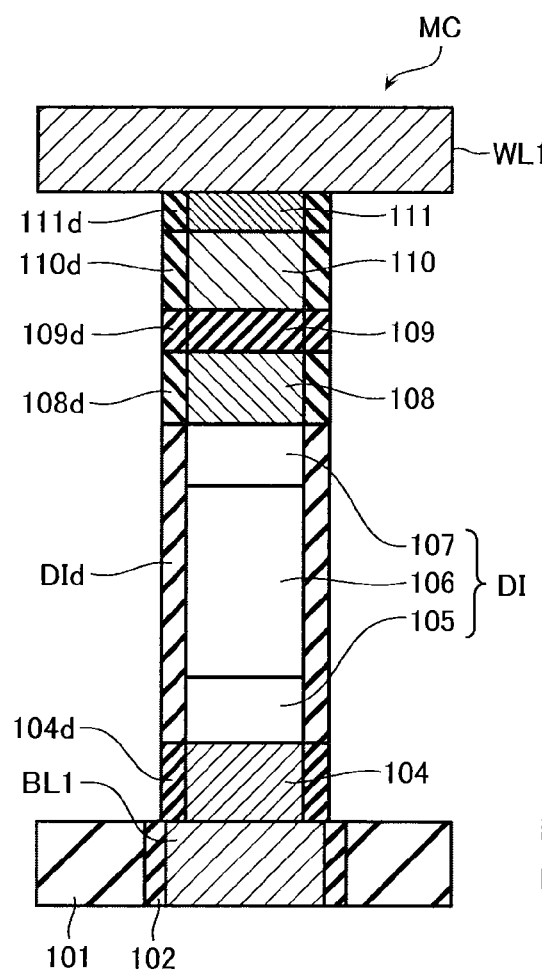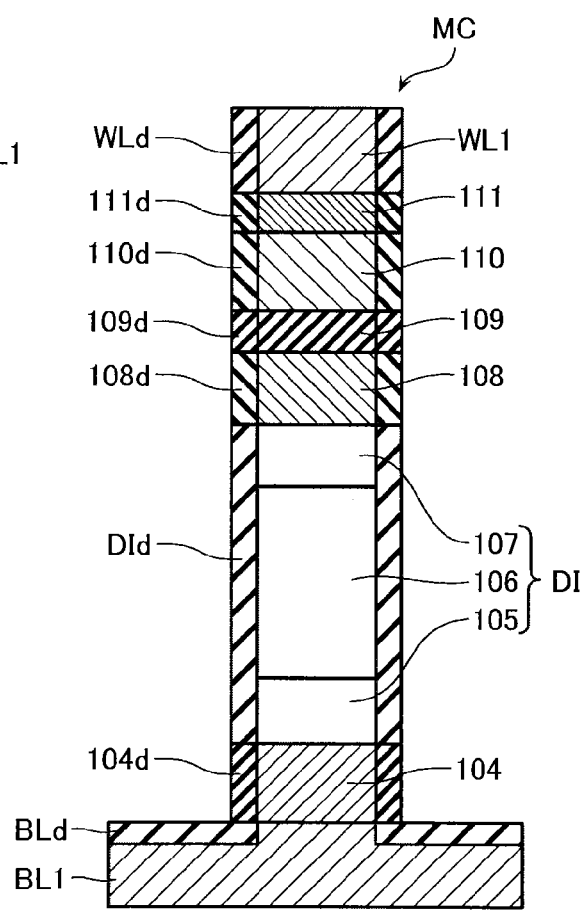

B - B' CROSS SECTION

C - C' CROSS SECTION

B - B' CROSS SECTION

C - C' CROSS SECTION

B - B' CROSS SECTION

C - C' CROSS SECTION

FIG. 40A
FIG. 40B
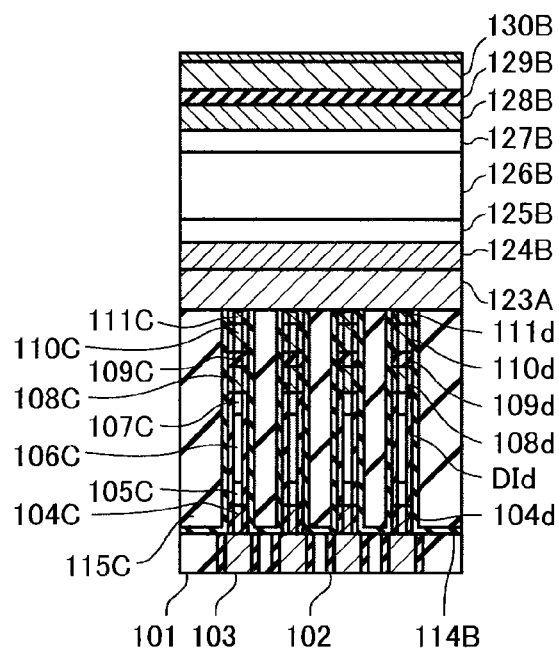
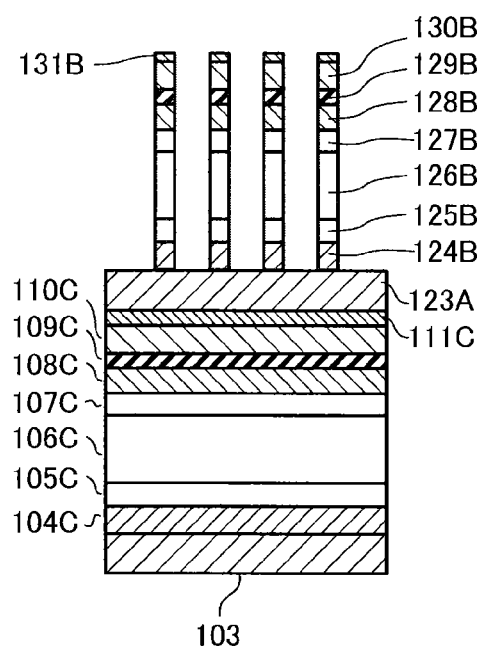
FIG. 41A
FIG. 41B
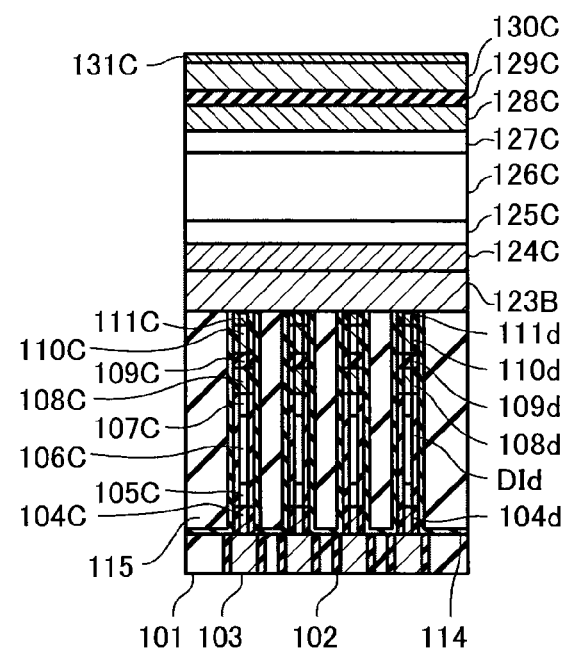
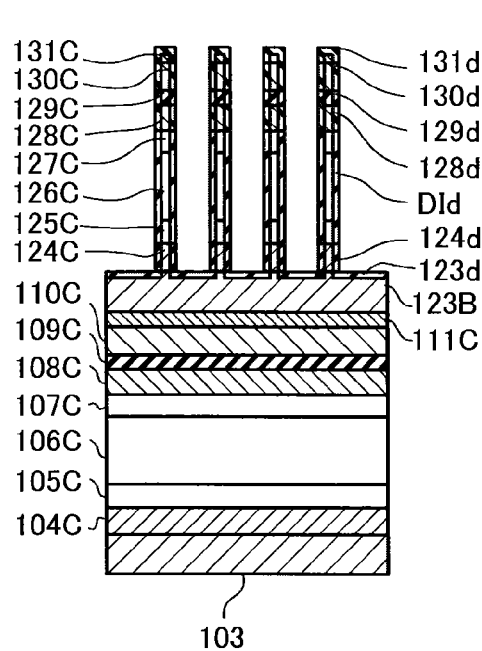

FIG. 46A
FIG. 46B
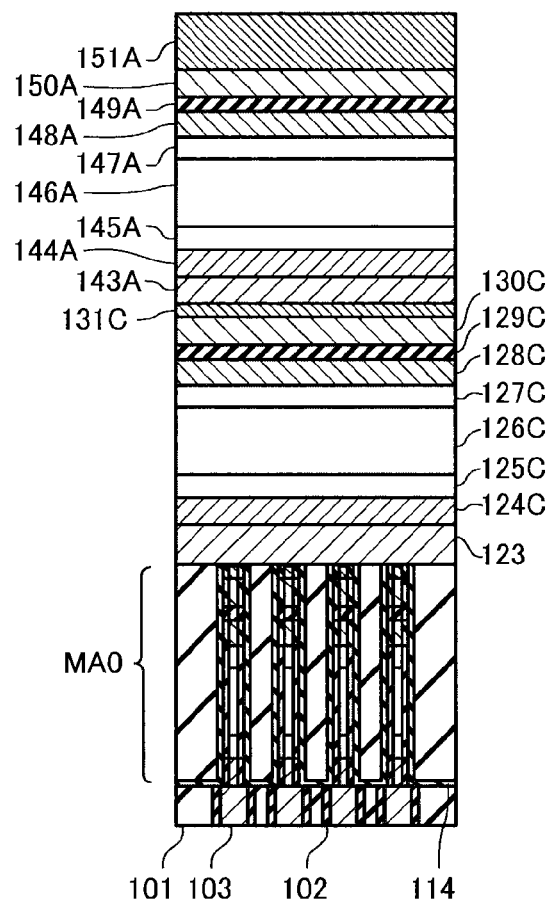
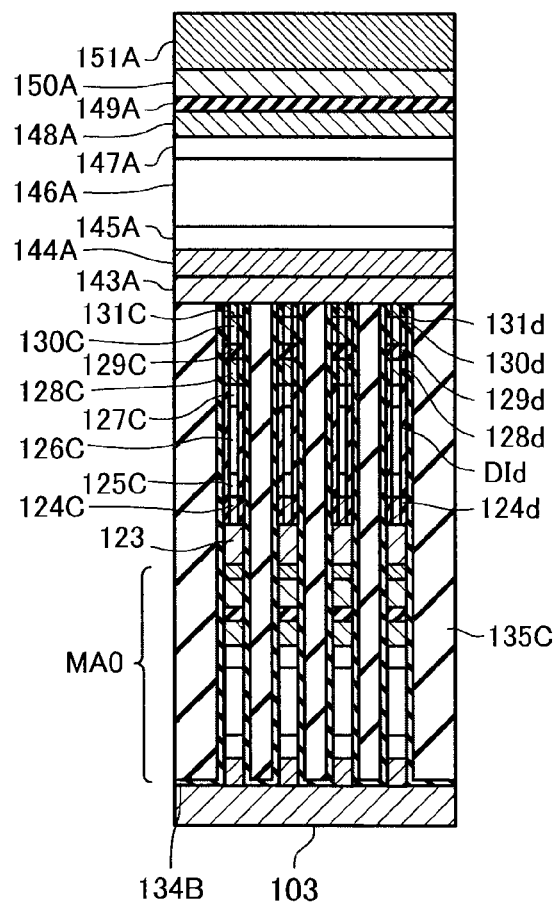

FIG. 49A
FIG. 49B
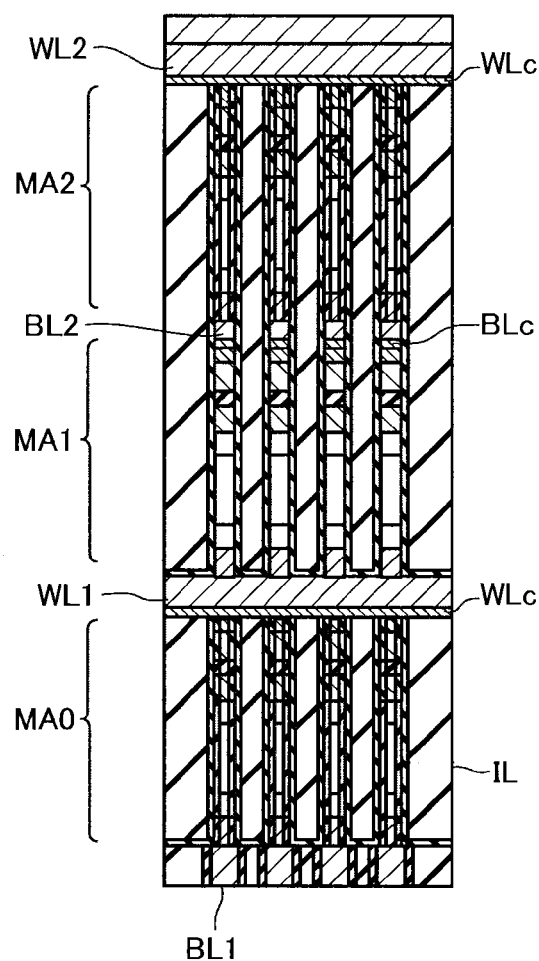
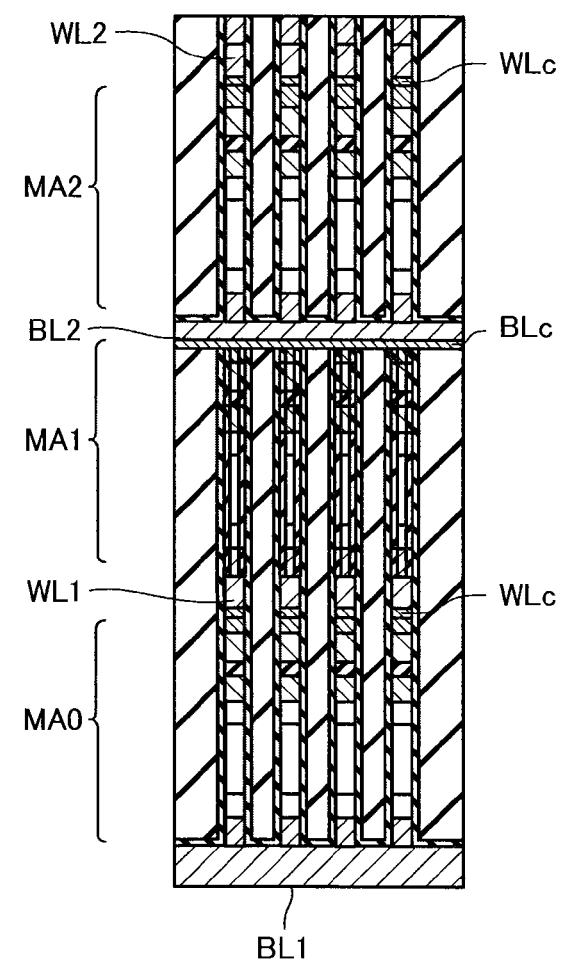

US 9,111,858 B2

NON-VOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2012-068423, filed on Mar. 23, 2012, the entire contents of which are incorporated herein by reference.

FIELD

Embodiments described herein relate to a non-volatile semiconductor memory device and a method for manufacturing the same.

BACKGROUND

Description of the Related Art

There has conventionally been known a flash memory, as an electrically rewritable nonvolatile memory, which includes a memory cell array of NAND-connected or NOR-connected memory cells having a floating gate structure. A ferroelectric memory is also known as a nonvolatile fast random access memory.

On the other hand, proposed technologies of further reducing the sizes of memory cells include resistance variable memory, which uses a variable resistance element in a memory cell. Known examples of the variable resistance element include a phase change memory device that varies the resistance value in accordance with the variation in crystal/amorphous states of a chalcogenide compound, an MRAM device that uses a variation in resistance caused by the tunnel magneto-resistance effect, a polymer ferroelectric RAM (PFRAM) memory device including resistance elements formed of a conductive polymer, a ReRAM device that causes a variation in resistance by electrical pulse application and so on.

In such a resistance variable memory, to control sneak current to a non-selective memory cell at the time of writing and reading data to and from a selected memory cell, a current control element such as a diode is connected in series with the variable resistance element. The variable resistance element and the current control element constitute a so-called cross point-type semiconductor memory device formed in a columnar shape between a first wire and a second wire by an etching process.

BRIEF DESCRIPTION OF THE DRAWINGS

FIGS. 10A to 10C are cross sectional views illustrating the method for manufacturing the memory cell;

FIGS. 17A and 17B are cross sectional views illustrating the method for manufacturing the memory cell;

FIGS. 18A and 18B are cross sectional views illustrating the method for manufacturing the memory cell;

FIGS. 24A and 24B are cross sectional views illustrating the method for manufacturing the memory cell;

FIGS. 27A and 27B are cross sectional views of a memory cell constituting the memory cell array;

FIGS. 40A and 40B are cross sectional views illustrating the method for manufacturing a memory cell constituting the memory cell array;

FIGS. 41A and 41B are cross sectional views illustrating the method for manufacturing the memory cell;

FIGS. 46A and 46B are cross sectional views illustrating the method for manufacturing the memory cell;

FIGS. 49A and 49B are cross sectional views of a memory cell array of a non-volatile semiconductor memory device according to a third embodiment.

DETAILED DESCRIPTION

A non-volatile semiconductor memory device according to embodiments includes a cell array layer including a first wire, one or more memory cells stacked on the first wire, and a second wire formed on the memory cell so as to cross the first wire. The memory cell includes a current rectifying element and a variable resistance element. An atomic composition ratio of nitrogen is higher than that of oxygen in a part of a sidewall of the current rectifying element.

Hereinafter, embodiments will be explained with reference to the attached drawings.

First Embodiment

Overall Configuration

Figure 1:
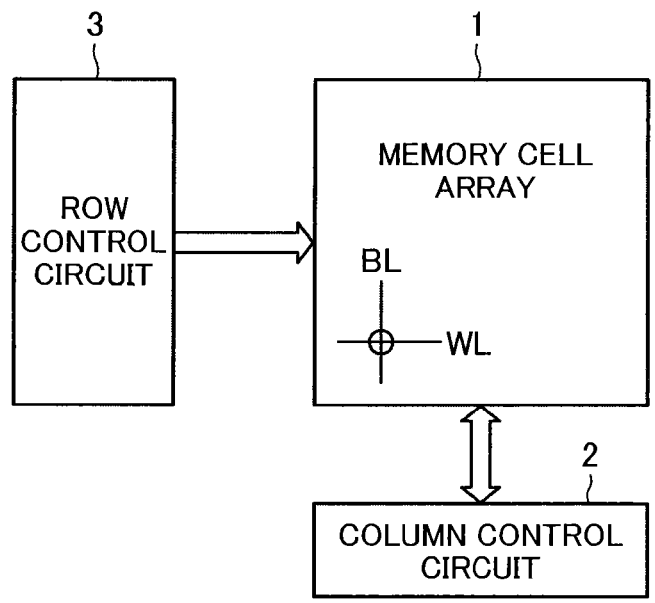
FIG. 1 is a block diagram illustrating a configuration of a non-volatile semiconductor memory device according to a first embodiment.

FIG. 1 is a block diagram illustrating a configuration of a non-volatile semiconductor memory device according to the first embodiment. This non-volatile semiconductor memory device includes a memory cell array 1 in which memory cells MC having variable resistance elements and current rectifying elements later explained are arranged in a matrix form.

A column control circuit 2 is electrically connected to bit lines BL of the memory cell array 1. The column control circuit 2 controls the bit lines BL of the memory cell array 1, and enables data-erase operation of a memory cell, data-write operation to a memory cell, and data-read operation from a memory cell. A row control circuit 3 is electrically connected to word lines WL of the memory cell array 1. The row control circuit 3 selects the word lines WL of the memory cell array 1, and enables data-erase operation of a memory cell, data-write operation to a memory cell, and data-read operation from a memory cell.

[Memory Cell Array]

Next, configuration of the memory cell array 1 of the non-volatile semiconductor memory device according to the first embodiment is described.

Figure 2:
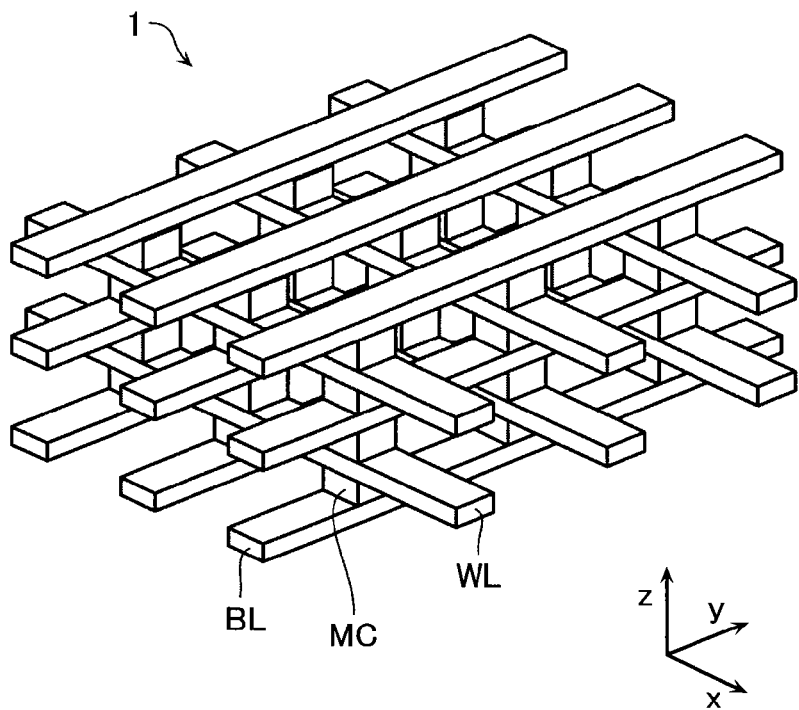
FIG. 2 is a perspective view illustrating a portion of a memory cell array of the non-volatile semiconductor memory device according to the embodiment.
Figure 3A:
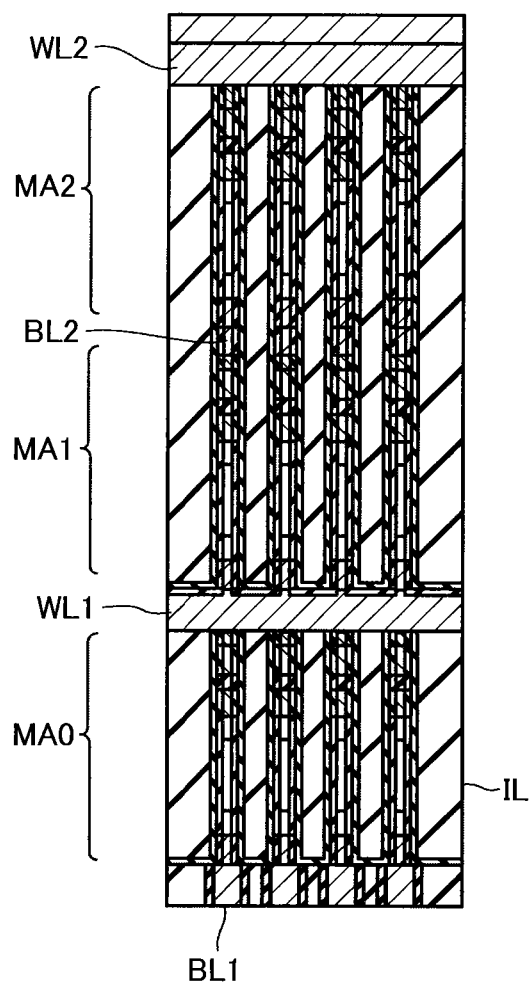
FIGS. 3A and 3B are cross sectional views illustrating a configuration of the memory cell.
Figure 3B:
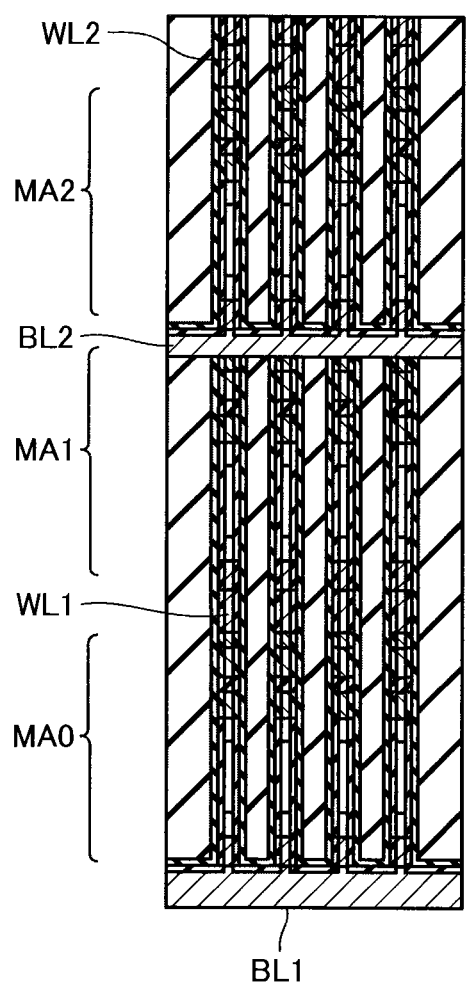
Figure 4A:
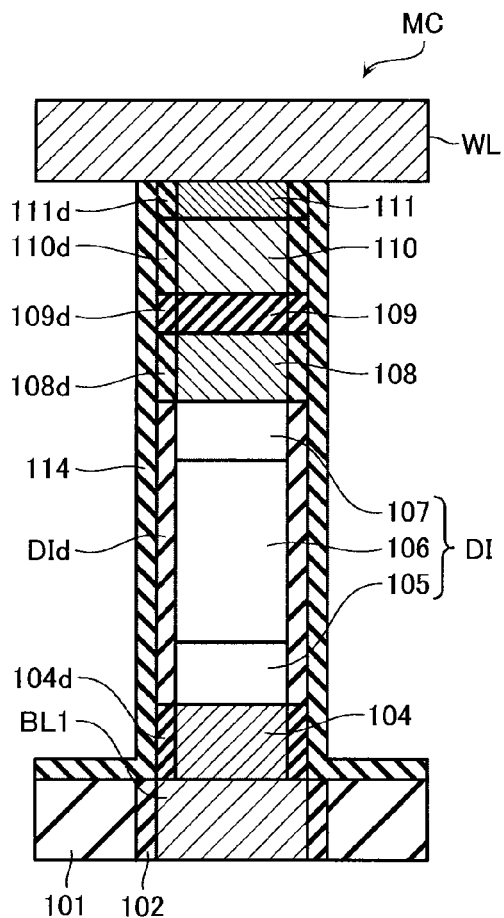
FIGS. 4A and 4B are cross sectional views illustrating a configuration of the memory cell.
Figure 4B:
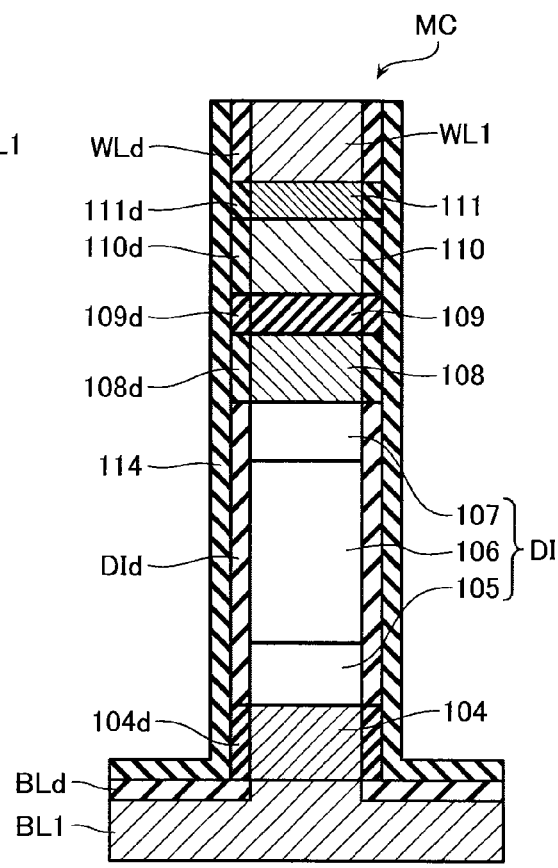

FIG. 2 is a perspective view illustrating a portion of the memory cell array 1. FIGS. 3A and 3B are cross sectional views of the memory cell. FIG. 3A is a cross sectional view viewed in a direction in which the bit line BL extends while FIG. 3B is a cross sectional view viewed in a direction in which the word line WL extends. FIGS. 4A and 4B are enlarged cross sectional views of one memory cell. FIG. 4A is an enlarged cross sectional view viewed in a direction in which the bit line BL extends while FIG. 4B is an enlarged cross sectional view viewed in a direction in which the word line WL extends.

As shown in FIG. 2, the memory cell array 1 is a cross point-type memory cell array. In the memory cell array 1, the plurality of word lines WL are arranged in parallel, and the plurality of bit lines BL crossing the word lines WL are arranged in parallel. A memory cell MC later explained is arranged at each crossing portion of a word line WL and a bit line BL in such a manner that the memory cell MC is sandwiched between both of the wires. Between the memory cells MC is buried an inter-layer insulating layer IL (FIGS. 3A and 3B). As shown in FIGS. 3A and 3B, the plurality of memory cells MC sharing the same word line WL and the bit line BL constitute a memory cell array layer MA, and a plurality of memory cell array layers MA are stacked to constitute the memory cell array 1. It should be noted that the word lines WL and the bit lines BL are desirably made of a material with a high degree of heat resistance and a low resistance value. Examples of such materials include tungsten (W), titanium (Ti), tungsten nitride (WN), titanium nitride (TiN), tungsten silicide (WSi), nickel silicide (NiSi), and cobalt silicide (CoSi). Tungsten (W) is adopted in the present embodiment.

[Memory Cell MC]

As shown in FIGS. 4A and 4B, the memory cell MC includes a variable resistance element 109 and a current rectifying element DI connected in series between the word line WL and the bit line BL buried via a barrier layer 102 in an inter-layer insulating layer 101. The bit line BL1 and the current rectifying element DI are electrically connected via a first electrode 104. The current rectifying element DI and the variable resistance element 109 are electrically connected via a second electrode 108. The variable resistance element 109 and the word line WL are electrically connected via a third electrode 110 and a top electrode 111. Also, sidewall nitrided layers BLd, 104d, DId, 108d-111d and WLd are formed on a part of the upper surface of the bit line BL1 not contacting the first electrode 104 and sidewalls of the first electrode 104, the current rectifying element DI, the second electrode 108, the variable resistance element 109, the third electrode 110, the top electrode 111, and the word line WL. The sidewall nitrided layers 104d-111d are covered with a barrier layer 114. Further, the inter-layer insulating layer IL (FIGS. 3A and 3B) is buried between the memory cells MC adjacent in the bit line BL direction and the word line WL direction.

In the present embodiment, a current rectifying direction of the current rectifying element DI in the memory cell MC located at a crossing portion of the bit line BL and the word line WL in a case where the bit line BL is located at the upper portion of the word line WL differs from the current rectifying direction in a case where the bit line BL is located at the lower portion of the word line WL. For example, in a selected memory cell MC, the current rectifying element DI has current rectifying characteristics to cause current to flow from the bit line BL to the word line WL at all times.

[Current Rectifying Element DI]

In the present embodiment, the current rectifying element DI is constituted by a PIN diode including a p-type semiconductor layer 105, an i-type semiconductor layer 106, and an n-type semiconductor layer 107. The p-type semiconductor layer 105 to the n-type semiconductor layer 107 are made of polysilicon. On the sidewalls of the p-type semiconductor layer 105 to the n-type semiconductor layer 107, a natural oxide film is not formed, but, in the present embodiment, the aforementioned sidewall nitrided layer DId is formed as thick as approximately 2-5 nm. In the present embodiment, the sidewall nitrided layer DId is generated by a nitridation process using plasma (hereinafter referred to as "plasma nitridation"), and impurity concentration in the sidewall nitrided layer DId is kept low. Note that, as for the current rectifying element DI used in the memory cell MC, the material, structure, and the like are not particularly limited as long as it is an element having predetermined current rectifying characteristics in terms of the voltage and current characteristics. That is, a PN-junction diode, a Schottky diode, a punch-through diode, or the like can be used as a diode. Also, to enable to obtain current rectifying characteristics that allow desired voltage and current to be supplied to a resistance variable layer of a selected memory cell MC, a semiconductor such as silicon germanium (SiGe) or germanium (Ge), mixed crystal of a semiconductor and a metal, or an insulator such as an oxide can be used instead of silicon (Si) as a material for the current rectifying element DI.

[Variable Resistance Element 109]

In the present embodiment, the variable resistance element 109 is made of HfO while the sidewall nitrided layer 109$d$ is made of HfON. However, materials for the variable resistance element 109 and the sidewall nitrided layer 109$d$ are not limited to these, but various materials are applicable.

The non-volatile semiconductor memory device according to the present embodiment is a so-called bipolar-type non-volatile semiconductor memory device. Data-write to a memory cell MC is performed by applying predetermined backward voltage to the variable resistance element 109 of the selected memory cell MC for a predetermined period of time. As a result, the state of the variable resistance element 109 of the selected memory cell MC is varied from a high-resistance state to a low-resistance state. Hereinafter, this operation of varying the state of the variable resistance element 109 from the high-resistance state to the low-resistance state is referred to as set operation. On the other hand, data-erase of the memory cell MC is performed by applying predetermined forward voltage to the variable resistance element 109 in the low-resistance state after the set operation for a predetermined period of time. As a result, the state of the variable resistance element 109 is varied from a low-resistance state to a high-resistance state. Hereinafter, this operation of varying the state of the variable resistance element 109 from the low-resistance state to the high-resistance state is referred to as reset operation. For example, memorization of binary data is performed by performing the reset operation and the set operation to the selected memory cell MC to vary the resistance state of the variable resistance element 109 of the selected memory cell MC to the high-resistance state and the low-resistance state. Also, hereinafter, the reset operation and the set operation are collectively referred to as switch operation.

[Characteristics of Switch Operation]

Figure 5:
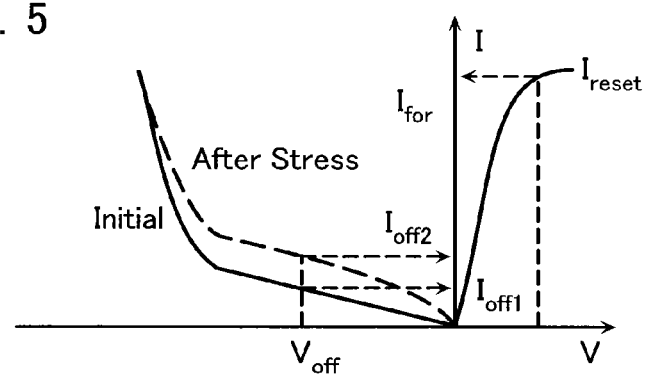
FIG. 5 is a graph illustrating write characteristics of a conventional non-volatile semiconductor memory device.

Subsequently, characteristics of switch operation of the non-volatile semiconductor memory device according to the present embodiment will be described. Known is a so-called bipolar-type non-volatile semiconductor memory device applying backward voltage of the current rectifying element DI to the memory cell MC at the time of the set operation and applying forward voltage at the time of the reset operation. In such a bipolar-type non-volatile semiconductor memory device, current rectifying characteristics are degraded along with an increase in the number of times of rewrite. FIG. 5 is a graph illustrating write characteristics of a conventional non-volatile semiconductor memory device, in which current-voltage characteristics of a memory cell immediately after manufacture are shown with a solid line while current-voltage characteristics of a memory cell after several times of the rewrite are shown with a dotted line. It is apparent from FIG. 5 that leak current at the time of applying off voltage Voff increases from Ioff1 immediately after manufacture of the non-volatile semiconductor memory device to Ioff2 after several times of rewrite. This problem becomes more obvious as the size of the memory cell array increases.

Although causes for the above problem have not been clarified completely, it is thought that the increase in leak current is caused by (1) the fact that impurities such as boron (B) doped in the n-type semiconductor layer in the current rectifying element diffuse into the natural oxide film formed on the sidewall of the current rectifying element through repeated rewrite to cause diode characteristics to be degraded or (2) the fact that impurities diffuse into the barrier layer formed on the sidewall of the variable resistance element through repeated rewrite to become a trap.

On the sidewall of the current rectifying element DI according to the present embodiment is formed the sidewall nitrided layer DId to prevent a natural oxide film from being formed. Also, since nitride is more stable than oxygen or hydrogen as a terminating element of polysilicon forming the current rectifying element, it is thought that formation of the sidewall nitrided layer DId can reduce diffusion of impurities in the barrier layer. Accordingly, it is possible to manufacture a non-volatile semiconductor memory device that reduces an increase in leak current along with an increase in the number of times of rewrite to suppress degradation.

[Composition Analysis]

Figure 6:
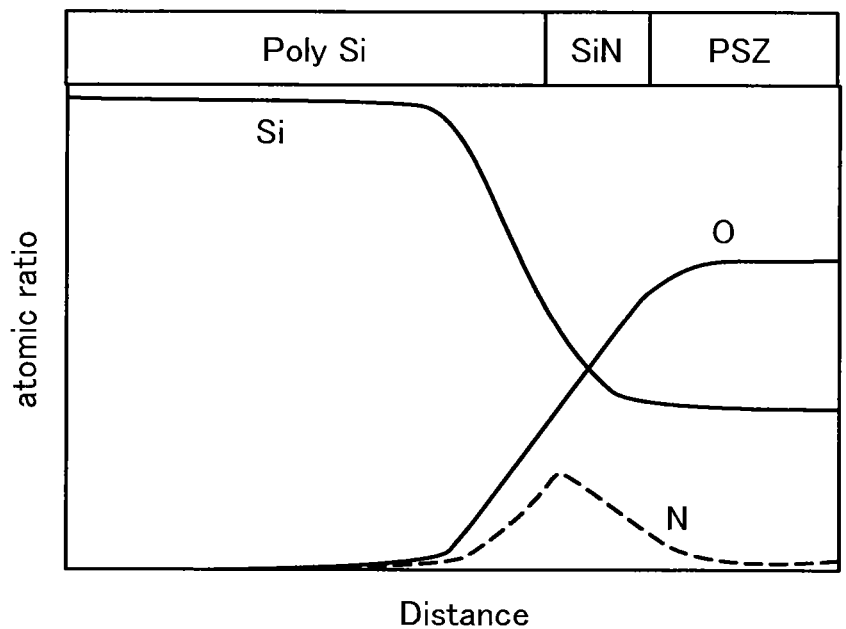
FIG. 6 is a schematic view illustrating a result of a composition analysis for a conventional memory cell.

Conventionally, it often occurs that a natural oxide film is formed on the sidewall of a current rectifying element constituting a memory cell in a manufacturing process. FIG. 6 illustrates a result of a composition analysis for a diode in the conventional memory cell. The vertical axis in FIG. 6 represents a composition ratio of each atom (hereinafter, atomic composition ratio) while the horizontal axis represents a position in a memory cell array. In FIG. 6, lines below "Poly Si" represent atomic composition ratios in the current rectifying element, lines below "SiN" represent those in a barrier layer, and lines below "PSZ" represent those in an inter-layer insulating layer. In the conventional memory cell, it is found that, since the natural oxide film is formed on the sidewall of the current rectifying element, an atomic composition ratio of oxygen surpasses an atomic composition ratio of nitrogen at the interface between the current rectifying element and the inter-layer insulating layer. Similarly, it is found that an atomic composition ratio of oxygen surpasses an atomic composition ratio of nitrogen in the barrier layer as well.

Figure 7:
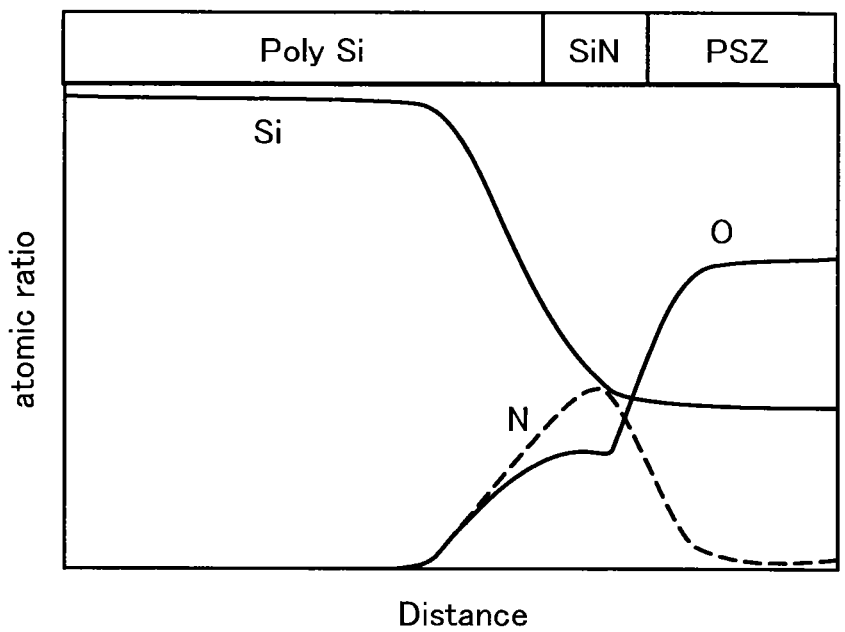
FIG. 7 is a schematic view illustrating a result of a composition analysis for the memory cell of the non-volatile semiconductor memory device according to the first embodiment.

FIG. 7 illustrates a result of a similar composition analysis to that in FIG. 6 in the non-volatile semiconductor memory device according to the present embodiment. In the present embodiment, since the sidewall nitrided layer DId is formed on the sidewall of the current rectifying element DI (In FIG. 7, an interface of "Poly Si" with "SiN") to prevent formation of the natural oxide film, it is found that an atomic composition ratio of nitrogen is higher than an atomic composition ratio of oxygen on the sidewall of the current rectifying element DI. It is also found that an atomic composition ratio of nitrogen surpasses an atomic composition ratio of oxygen in the barrier layer except an interface between the barrier layer and the inter-layer insulating layer (In FIG. 7, an interface between "SiN" and "PSZ").

[Nitridation Process]

Subsequently, prior to description of a manufacturing method of the semiconductor memory device according to the present embodiment, a nitridation process for use in generation of the sidewall nitrided layer will be described. For generation of the sidewall nitrided layer, various nitridation processes are applicable, but plasma nitridation using plasma will be used in the present embodiment as described above. Examples of an applicable plasma nitridation method are an SPA (Slot Plane Antenna) nitridation method, which is a plasma nitridation method using a plane antenna, an ICP (Inductively Coupled Plasma) using inductively coupled plasma, and a nitridation method using MMT (Modified Magnetron Typed) plasma. An example of an applicable nitridation process other than plasma nitridation is thermal nitridation. For example, an etched pattern may be annealed at 600° C. or so in the nitrogen atmosphere.

[Manufacturing Method]

Subsequently, with reference to FIGS. 8A to 25B, the manufacturing method of the semiconductor memory device according to the present embodiment will be explained. In FIGS. 8A to 16C, A is a plan view, B is a B-B' cross sectional view of A, and C is a C-C' cross sectional view of A. Also, in FIGS. 17A to 25B, A is a cross sectional view corresponding to B-B' in FIG. 16A, and B is a cross sectional view corresponding to C-C' in FIG. 16A.

Figure 8A:
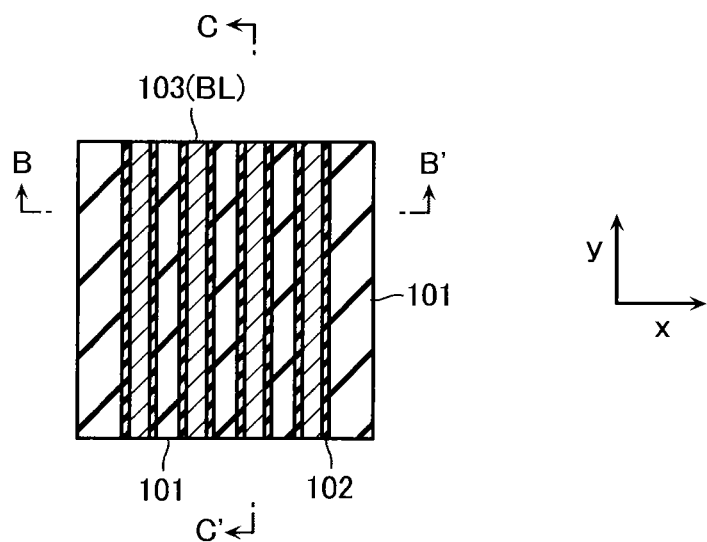
FIGS. 8A to 8C are cross sectional views illustrating a method for manufacturing the memory cell.
Figure 8B:
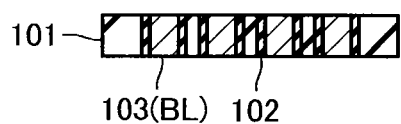
Figure 8C:
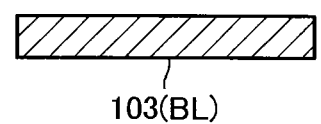

First, as shown in FIGS. 8A to 8C, the inter-layer insulating layers 101 and the bit lines 103 (BL) of which sidewalls are covered with barrier layers 102 are formed by embedding method or RIE. The barrier layer 102 may be an insulating body such as SiN. The bit lines 103 extending the y direction are arranged in the x direction intersecting the y direction.

Figure 9A:
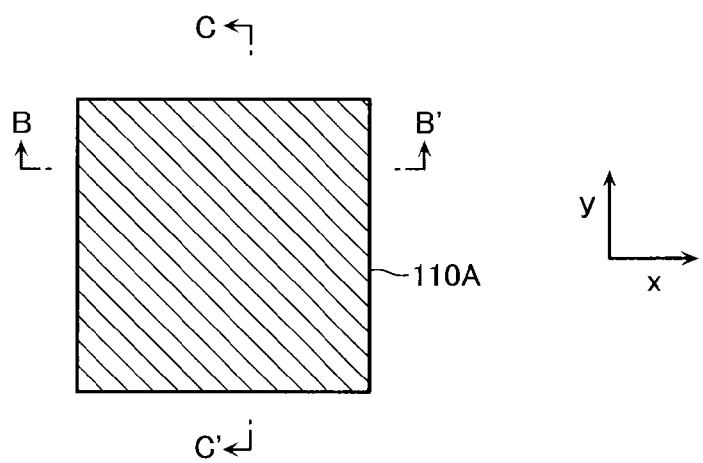
FIGS. 9A to 9C are cross sectional views illustrating the method for manufacturing the memory cell.
Figure 9B:
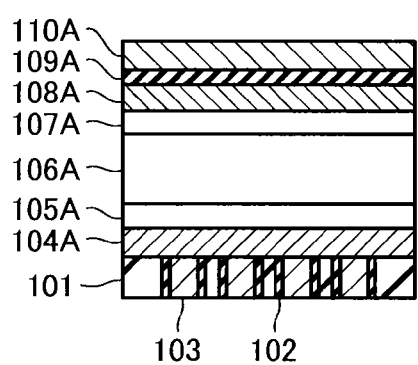
Figure 9C:
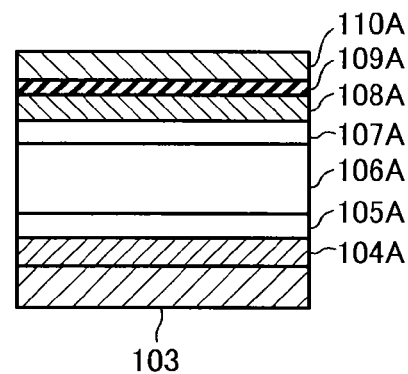

Subsequently, as shown in FIGS. 9A to 9C, a conductive layer 104A serving as a first electrode 104, a p-type semiconductor layer 105A, an i-type semiconductor layer 106A, an n-type semiconductor layer 107A, a conductive layer 108A serving as a second electrode 108, a variable resistance layer 109A serving as a variable resistance element 109, and a conductive layer 110A serving as a third electrode 110 are deposited on the surface of the bit lines 103, barrier layers 102 and the inter-layer insulating layers 101. The conductive layers 104A and 110A may be a conductive body such as TiN, and the conductive layer 108A may be a conductive body such as TiN and Ti. The variable resistance layer 109A may be $TiO_2$, NiO, MeOx, HfO, Carbon, and the like.

Subsequently, as shown in FIGS. 10A to 10C, a conductive layer 111A serving as a top electrode 111 and an HM (hardmask) layer 112 are deposited on the conductive layer 110A, and a line-and-space resist pattern 113 is formed thereon. The conductive layer 111A may be a conductive body such as W, and the HM layer 112 may be $SiO_2$, SiN, C, and the like. Applicable patterning processes of the resist pattern 113 include sidewall transfer method and ArF immersion patterning processes. The resist pattern 113 is formed to overlap the bit lines 103 in the xy plane.

Figure 11A:
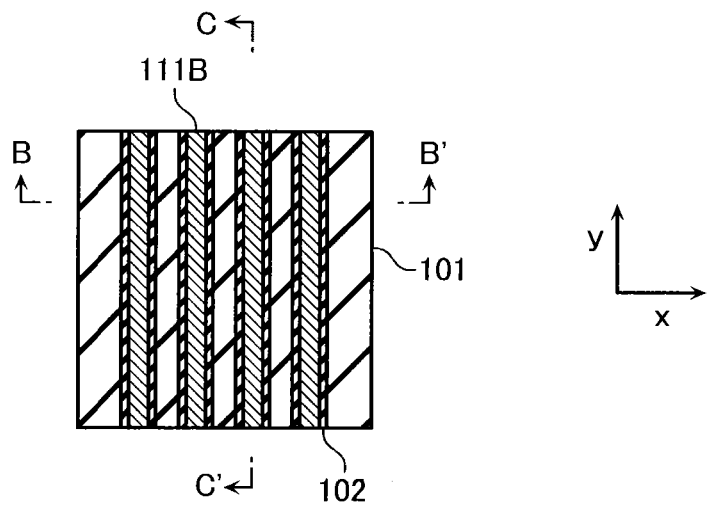
FIGS. 11A to 11C are cross sectional views illustrating the method for manufacturing the memory cell.
Figure 11B:
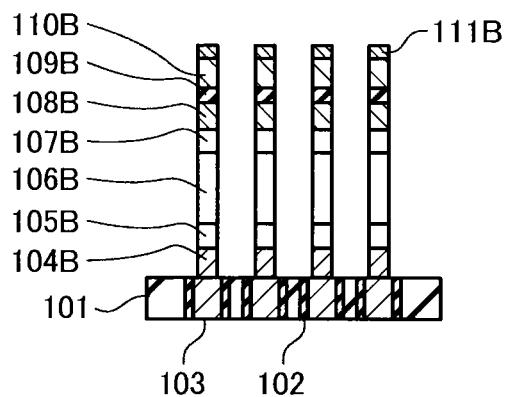
Figure 11C:
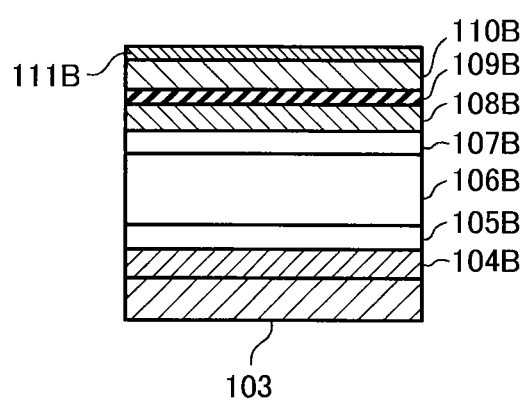

Subsequently, as shown in FIGS. 11A to 11C, using the resist pattern 113 as a mask, the HM layer 112 and conductive layer 111A are processed by etching. Thereafter, using the processed HM layer 112 as a mask, the range from the conductive layer 104A to the conductive layer 110A is etched. Thereby, the structure is formed along the bit lines 103, in which an electrode 104B, a p-type semiconductor layer 105B, an i-type semiconductor layer 106B, an n-type semiconductor layer 107B, a conductive layer 108B, a variable resistance layer 109B, a conductive layer 110B, and a conductive layer 111B are stacked. At this occasion, the sidewall from the electrode 104B to the conductive layer 111B is formed to be substantially perpendicular to the surface of the bit line 103, barrier layer 102 and the inter-layer insulating layer 101.

Figure 12A:
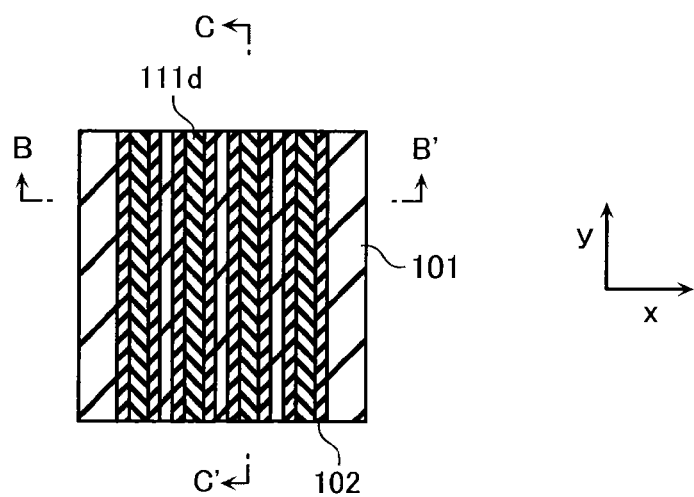
FIGS. 12A to 12C are cross sectional views illustrating the method for manufacturing the memory cell.
Figure 12B:
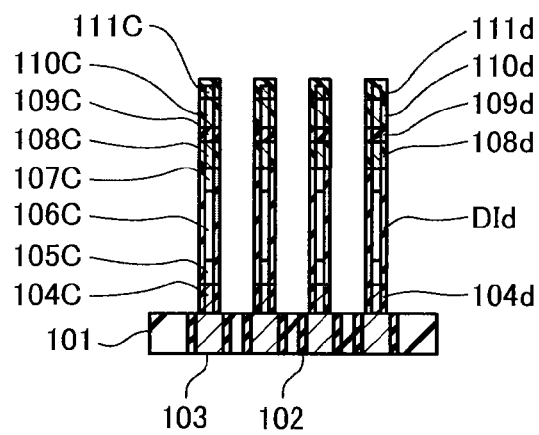
Figure 12C:
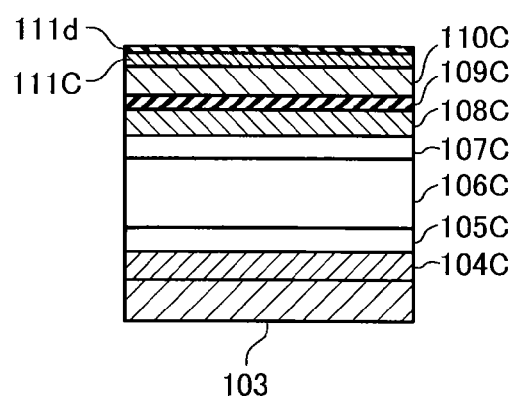

Subsequently, as shown in FIGS. 12A to 12C, the sidewall of the structure in which the electrode 104B, the p-type semiconductor layer 105B, the i-type semiconductor layer 106B, the n-type semiconductor layer 107B, the conductive layer 108B, the variable resistance layer 109B, the conductive layer 110B, and the conductive layer 111B are stacked is nitrided as much as 2-5 nm or so by plasma nitridation to form a sidewall nitrided layers 104d, DId, and 108d-111d on the sidewalls of an electrode 104C, a p-type semiconductor layer 105C, an i-type semiconductor layer 106C, an n-type semiconductor layer 107C, a conductive layer 108C, a variable resistance layer 109C, a conductive layer 110C, and a conductive layer 111C and on the upper surface of the top electrode 111C. By this process, oxygen in the natural oxide film formed on the sidewall of the etched pattern is substituted with nitrogen. Since plasma nitridation is used in the present embodiment, it is possible to form the sidewall nitrided layer with fewer impurities.

Figure 13A:
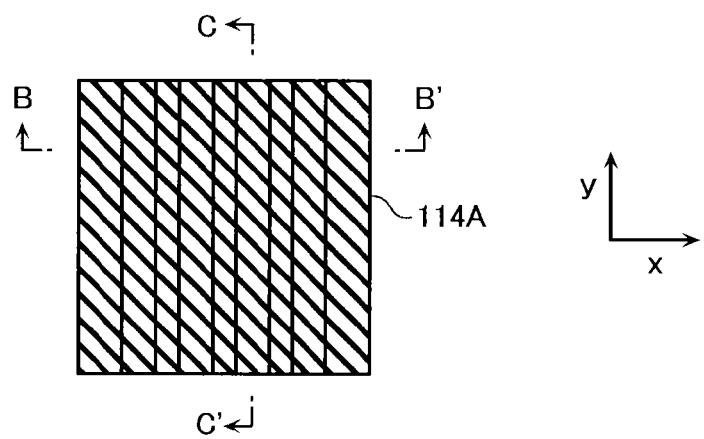
FIGS. 13A to 13C are cross sectional views illustrating the method for manufacturing the memory cell.
Figure 13B:
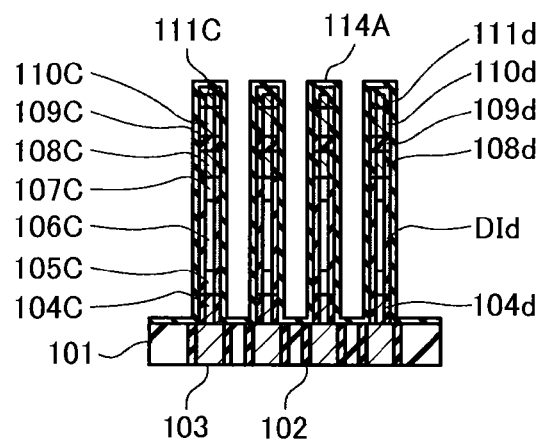
Figure 13C:
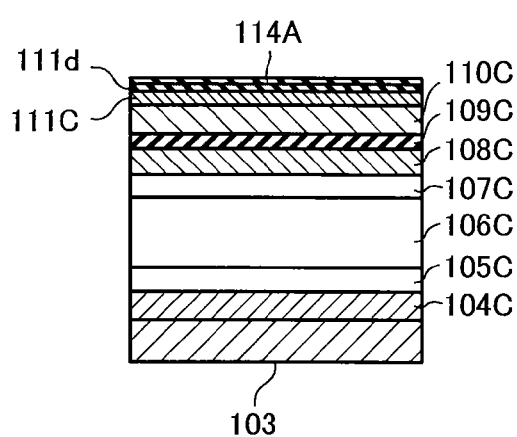

Subsequently, as shown in FIGS. 13A to 13C, an insulating layer 114A serving as a barrier layer 114 is formed to cover the surface of the inter-layer insulating layer 101 and the side surface of the sidewall nitrided layer 104d, DId, 108d-111d. The insulating layer 114A may be ALD-SiN, PeCVD-SiN, and the like. In a case where SiN is adopted as the insulating layer 114A, a composition ratio of Si and N is preferably N/Si=1.22 or less. Also, a multiple sidewall structure such as $SiO_2$/SiN or $SiN/SiO_2$/SiN may be used.

Figure 14A:
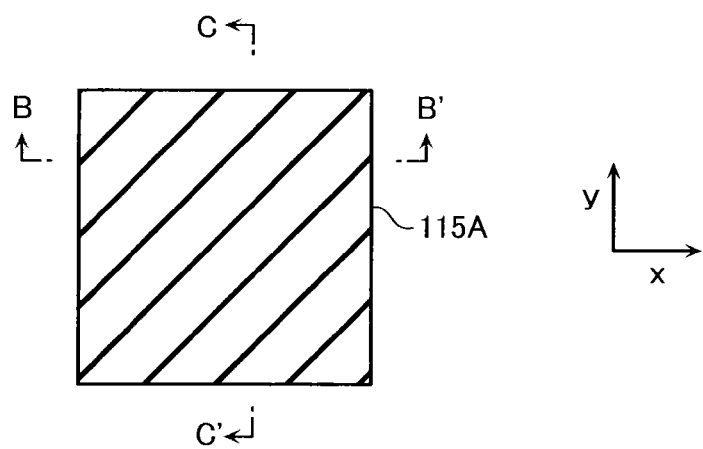
FIGS. 14A to 14C are cross sectional views illustrating the method for manufacturing the memory cell.
Figure 14B:
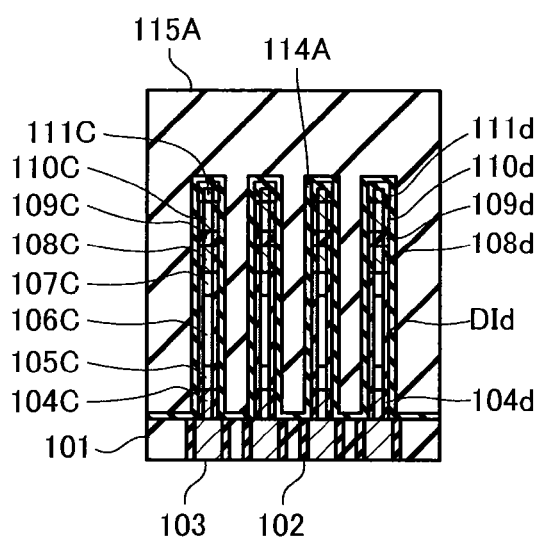
Figure 14C:
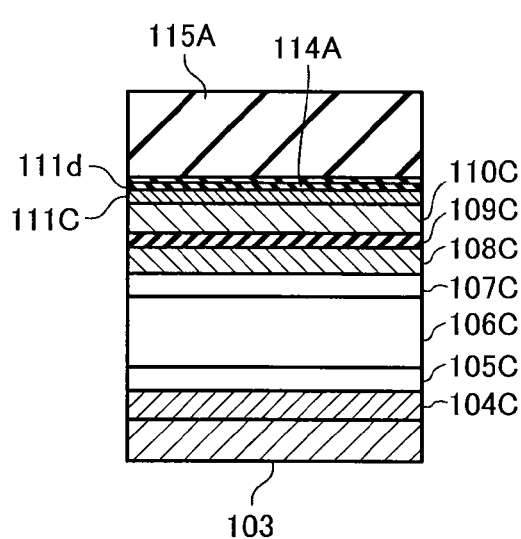
Figure 15A:
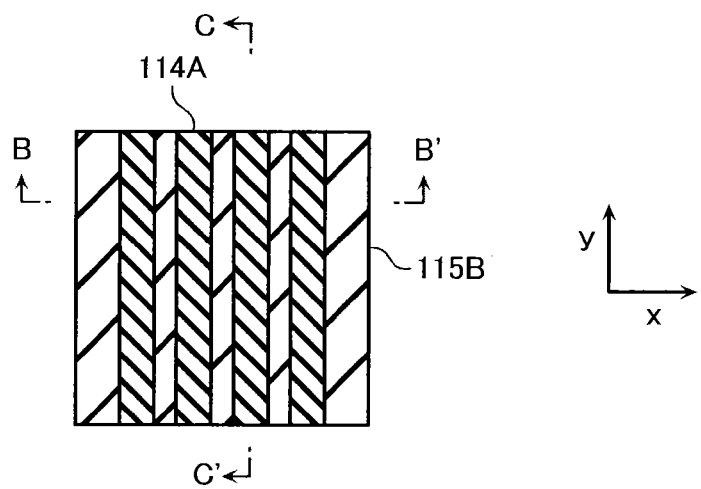
FIGS. 15A to 15C are cross sectional views illustrating the method for manufacturing the memory cell.
Figure 15B:
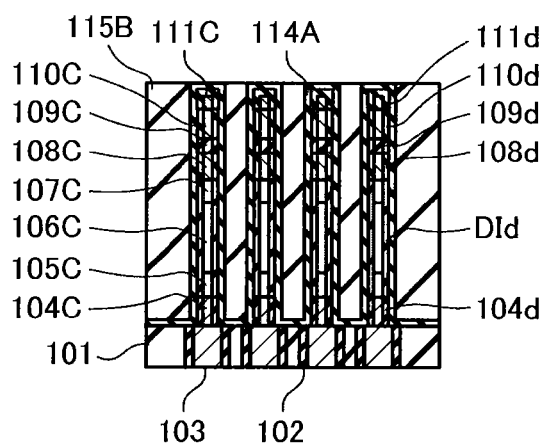
Figure 15C:
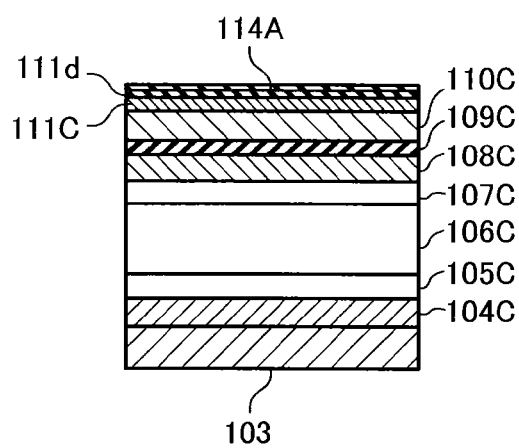
Figure 16A:
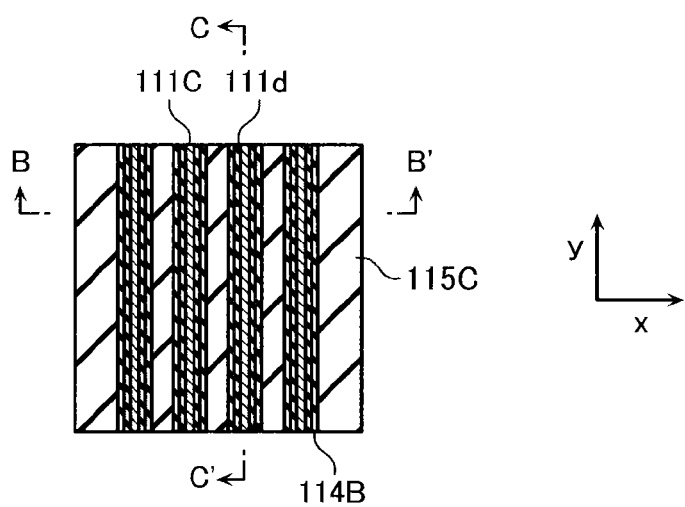
FIGS. 16A to 16C are cross sectional views illustrating the method for manufacturing the memory cell.
Figure 16B:
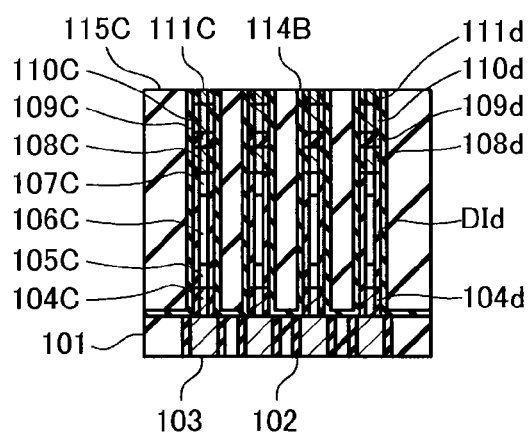
Figure 16C:
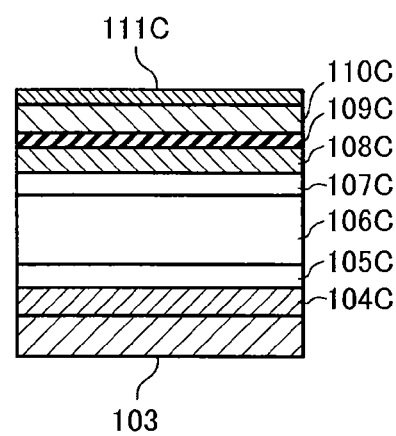

Subsequently, as shown in FIGS. 14A to 14C, the inter-layer insulating layer 115A serving as the inter layer insulating layer IL in the memory cell array layer MA is deposited, and steam oxidation is performed. However, if the inter-layer insulating layer 115A is not a coating layer, steam oxidation processing is not necessary. The inter layer insulating layer 115A may be poly-silazane. Thereafter, as shown in FIGS. 15A to 15C, the inter-layer insulating layer 115A is subjected to CMP until the insulating layer 114A is exposed, so that the inter-layer insulating layer 115B is formed. Subsequently, as shown in FIGS. 16A to 16C, the exposed insulating layer 114A as well as the inter-layer insulating layer 115B are removed by CMP until the conductive layer 111C is exposed, so that the insulating layer 114B and the inter-layer insulating layer 115C is formed.

Subsequently, as shown in FIGS. 17A and 17B, a conductive layer 123A serving as a word line WL1, a conductive layer 124A serving as a first electrode 124, an n-type semiconductor layer 125A, an i-type semiconductor layer 126A, a p-type semiconductor layer 127A, a conductive layer 128A serving as a second electrode 128, a variable resistance layer 129A, a conductive layer 130A serving as a third electrode 130, a conductive layer 131A serving as a top electrode 131, an HM layer 132, and a resist pattern 133 are formed according to substantially the same steps as the steps shown in FIGS. 9A to 9C and FIGS. 10A to 10C. The materials for the conductive layer 124A to the HM layer 132A may be the materials used in the layers corresponding to the respective layers from the conductive layer 104A to the HM layer 112A. The resist pattern 133 is a line-and-space formed to be perpendicular to the bit lines BL within the xy plane. In FIGS. 9A to 9C, the p-type semiconductor layer 105A, the i-type semiconductor layer 106A, and the n-type semiconductor layer 107A are deposited in this order from the side closer to the conductive layer 104A on the surface of the bit line 103. In contrast, in FIGS. 17A and 17B, the n-type semiconductor layer 125A, the i-type semiconductor layer 126A, and the p-type semiconductor layer 127A are deposited in this order from the side closer to the conductive layer 124A. This is because in the semiconductor memory device according to the present embodiment, a direction from the bit line BL to the word line WL via the memory cell MC is referred to as a forward direction of current.

Subsequently, as shown in FIGS. 18A and 18B, etching process is performed according to substantially the same steps as those in FIGS. 11A to 11C to form a stacked layer structure. The stacked layer structure includes a word line 123 (WL1), an electrode 124B, an n-type semiconductor layer 125B, an i-type semiconductor layer 126B, a p-type semiconductor layer 127B, a conductive layer 128B, a variable resistance layer 129B, a conductive layer 130B, a conductive layer 131B, a conductive layer 104D, a p-type semiconductor layer 105D, an i-type semiconductor layer 106D, an n-type semiconductor layer 107D, a conductive layer 108D, a variable resistance layer 109D, a conductive layer 110D and a conductive layer 111D.

Figure 19A:
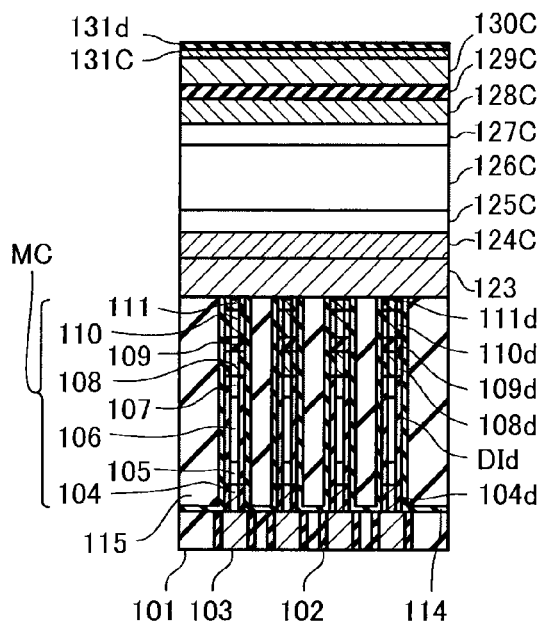
FIGS. 19A and 19B are cross sectional views illustrating the method for manufacturing the memory cell.
Figure 19B:
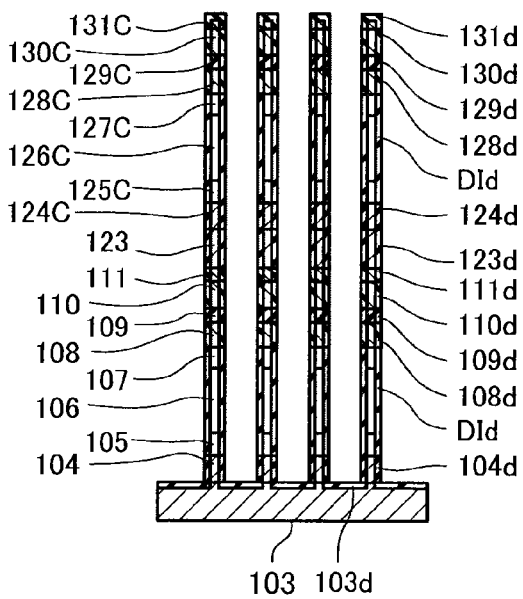

Subsequently, as shown in FIGS. 19A and 19B, the sidewall of the stacked layer structure formed is nitrided by plasma nitridation to form a sidewall nitrided layer 103d on the upper surface of the bit line 103 and form a sidewall nitrided layer 104d, DId, 108d-111d, 123d, 124d, DId, and 128d-131d on the sidewalls of a first electrode 104, a p-type semiconductor layer 105, an i-type semiconductor layer 106, an n-type semiconductor layer 107, a second electrode 108, a variable resistance element 109, a third electrode 110, a top electrode 111, a word line 123, a conductive layer 124C, an n-type semiconductor layer 125C, an i-type semiconductor layer 126C, a p-type semiconductor layer 127C, a conductive layer 128C, a variable resistance layer 129C, a conductive layer 130C, and a conductive layer 131C. By this process, a plurality of the memory cells MC constituting the memory cell array layer MA0 is formed.

Figure 20A:
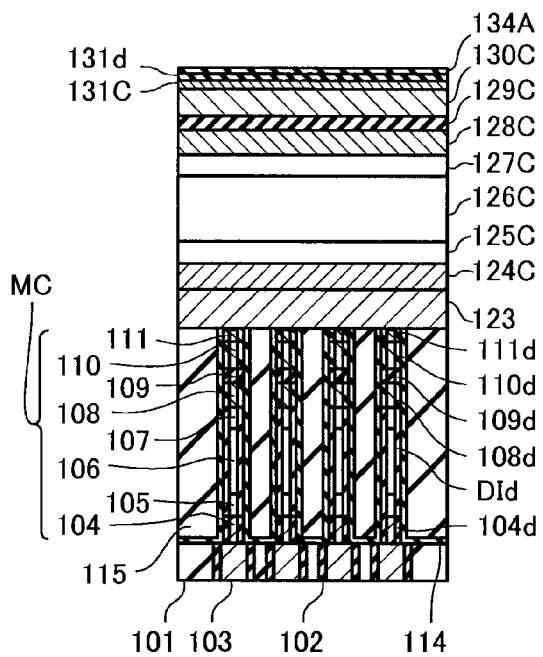
FIGS. 20A and 20B are cross sectional views illustrating the method for manufacturing the memory cell.
Figure 20B:
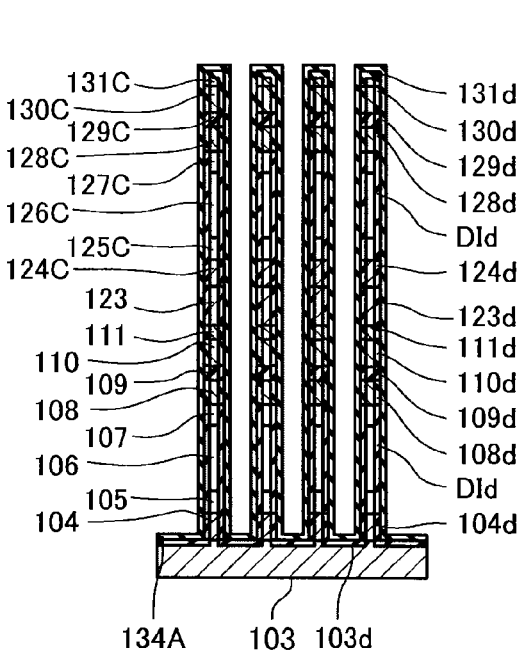

Subsequently, as shown in FIGS. 20A and 20B, a insulating layer 134A serving as a barrier layer 134 is formed to cover the upper surface of the sidewall nitrided layer 103d, the side walls extending from the sidewall nitrided layer 104d to 131d and the upper surfaces of the sidewall nitrided layer 131d. The same material as the material for the insulating layer 114 can be used for the insulating layer 134A.

Figure 21A:
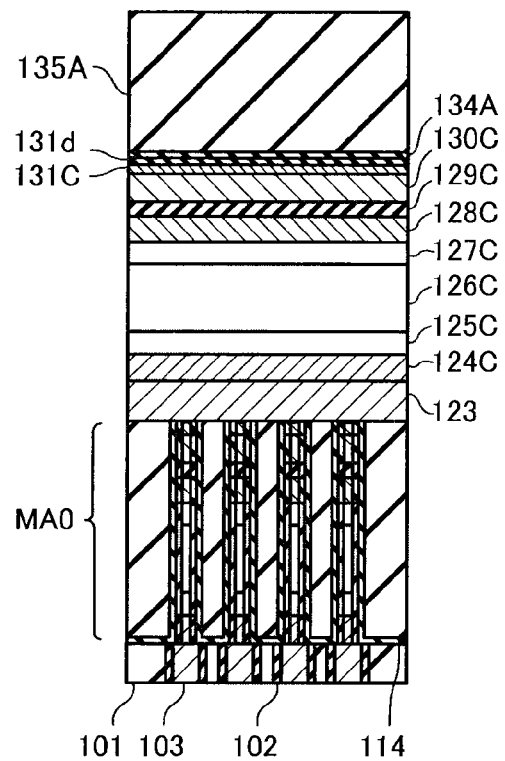
FIGS. 21A and 21B are cross sectional views illustrating the method for manufacturing the memory cell.
Figure 21B:
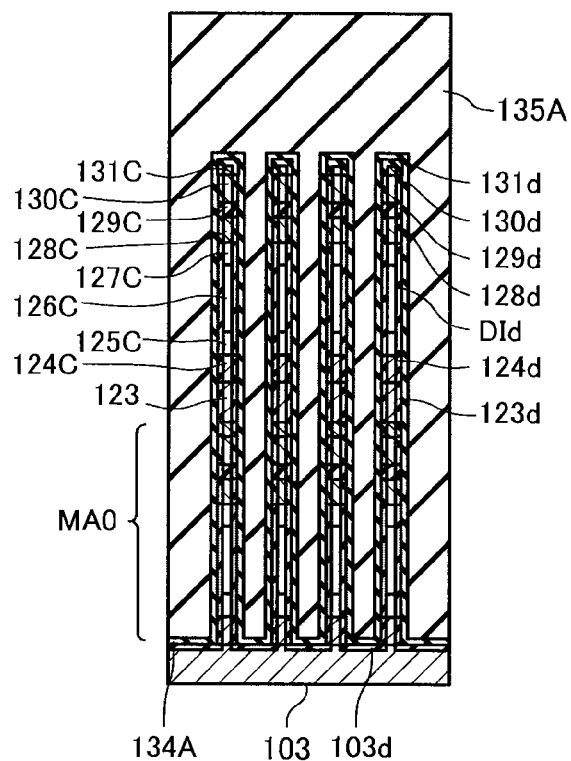
Figure 22A:
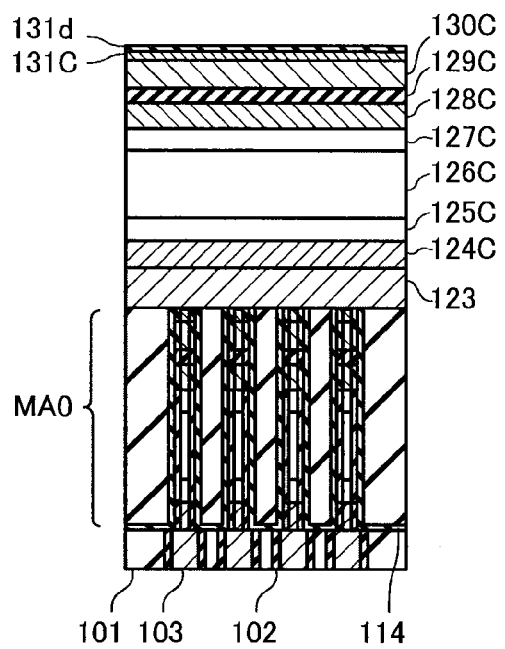
FIGS. 22A and 22B are cross sectional views illustrating the method for manufacturing the memory cell.
Figure 22B:
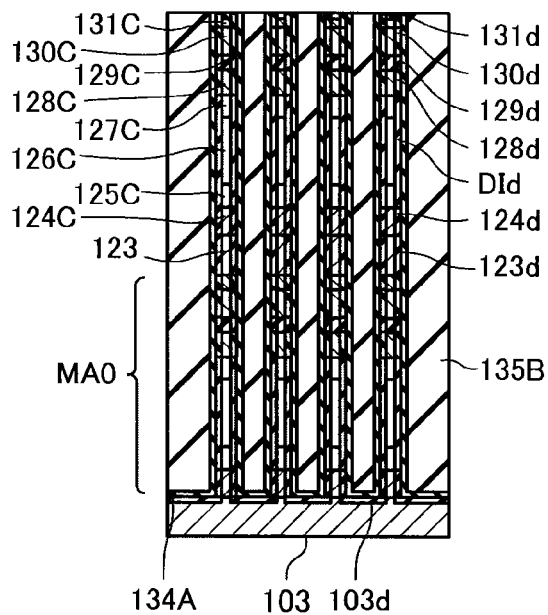
Figure 23A:
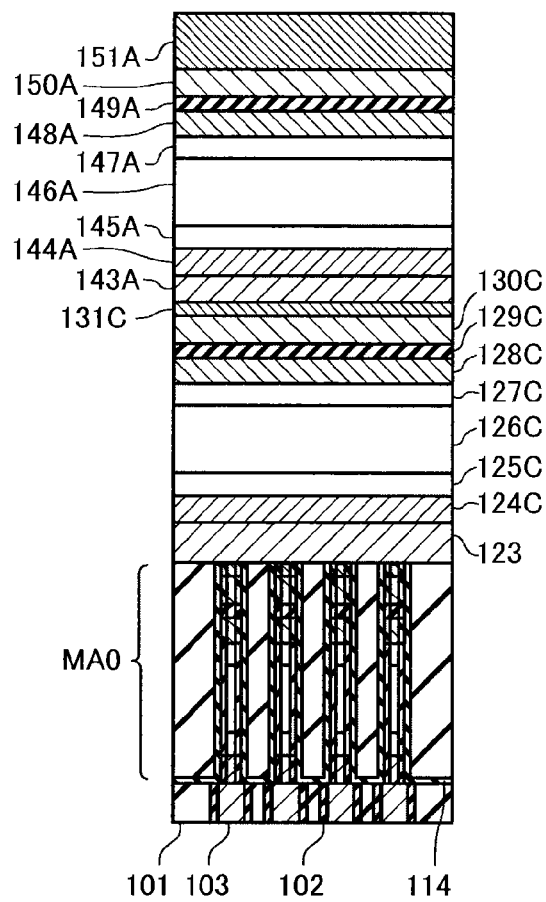
FIGS. 23A and 23B are cross sectional views illustrating the method for manufacturing the memory cell.
Figure 23B:
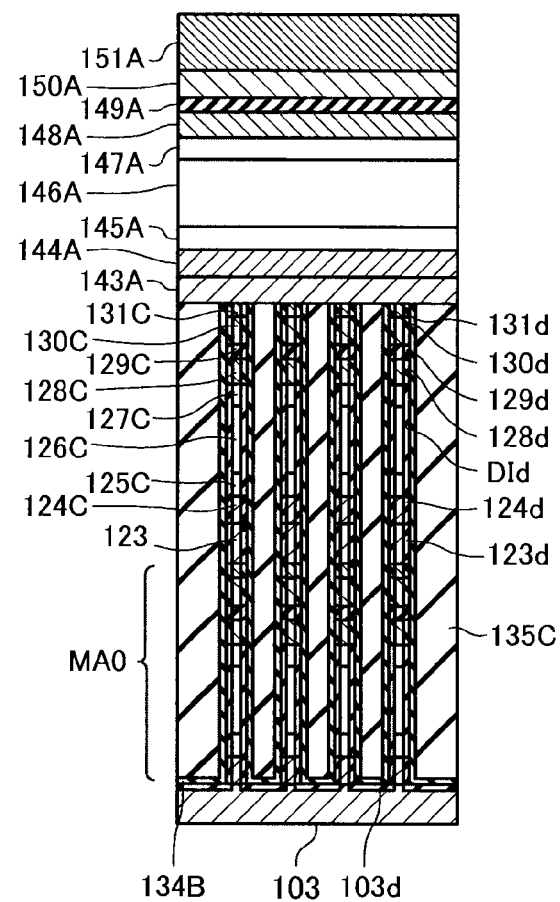

Subsequently, as shown in FIGS. 21A and 21B, an inter-layer insulating layer 135A is deposited, and steam oxidation is performed to form a memory cell array layer MA0. Note that if the inter-layer insulating layer 135A is not a coating layer, steam oxidation processing is not necessary. The same material as the material for inter layer insulating layer 115A can be used for the inter layer insulating layer 135A. Thereafter, as shown in FIGS. 22A and 22B, the inter-layer insulating layer 135A is subjected to CMP, and the insulating layer 134A is exposed, so that an inter-layer insulating layer 135B is formed. Subsequently, as shown in FIGS. 23A and 23B, the exposed insulating layer 134A as well as the inter-layer insulating layer 135B are removed by CMP until the conductive layer 131B is exposed, so that the insulating layer 134B and the inter-layer insulating layer 135C is formed, and further, a conductive layer 143A serving as a bit line BL2, a conductive layer 144A serving as a first electrode 144, a p-type semiconductor layer 145A, an i-type semiconductor layer 146A, an n-type semiconductor layer 147A, a conductive layer 148A serving as a second electrode 148, a variable resistance layer 149A serving as a variable resistance element 149, a conductive layer 150A serving as a third electrode 150, and a conductive layer 151A serving as a top electrode 151 are deposited thereon. The materials for the conductive layer 144A to the conductive layer 151A may be the materials used in the layers corresponding to the respective layers from the conductive layer 144A to the conductive layer 151A.

Thereafter, as shown in FIGS. 24A and 24B, an HM layer 152 and a resist pattern 153 are deposited. The resist pattern 153 is a line-and-space formed to be parallel to the bit lines BL. The HM layer 152 may be made of the same materials as the materials for the HM layer 132.

Figure 25A:
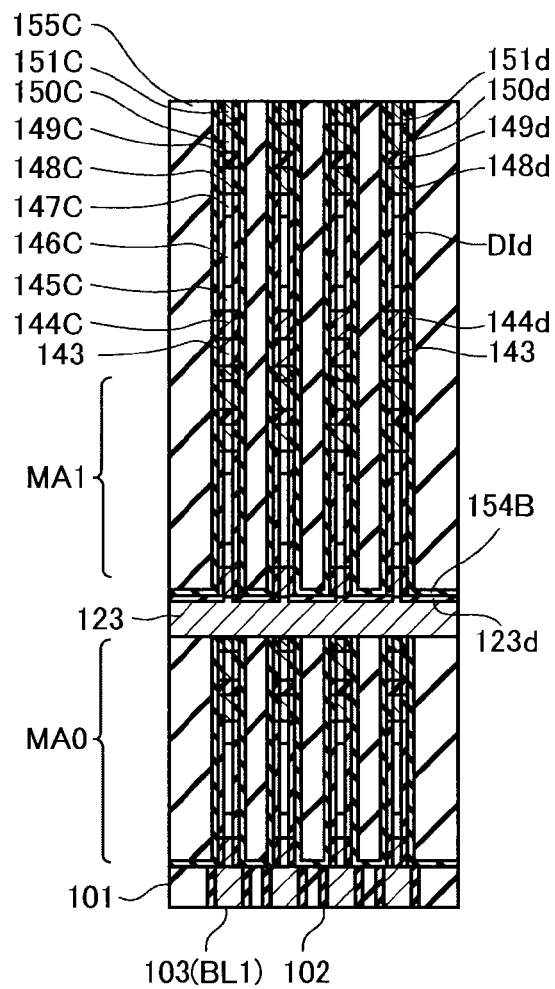
FIGS. 25A and 25B are cross sectional views illustrating the method for manufacturing the memory cell.
Figure 25B:
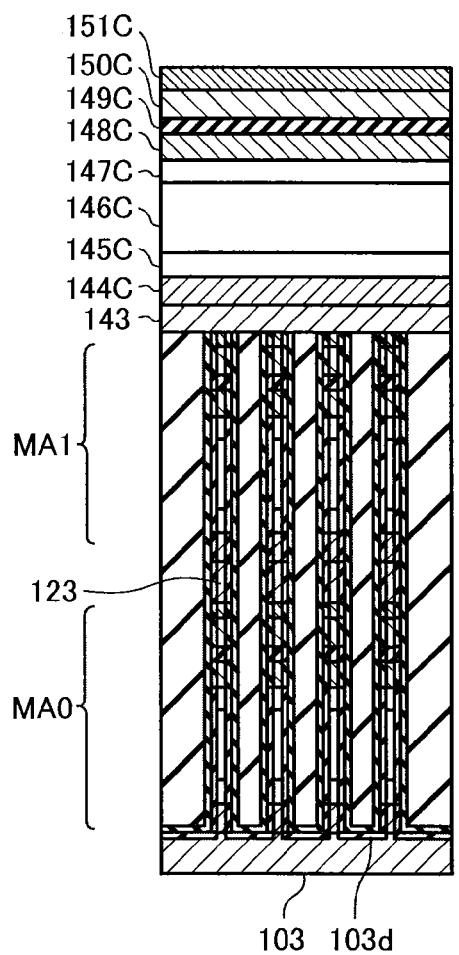

Thereafter, as shown in FIGS. 25A and 25B, etching is performed according to the same steps as those explained in FIGS. 18A to 22C, plasma nitridation to a pattern formed by the etching is performed, and a barrier layer and an inter-layer insulating layer are deposited. Accordingly, an insulating layer 154B and an inter-layer insulating layer 155C are formed by CMP. Hereinafter, a memory cell array 1 having a stacked layer structure is formed on the basis of the same steps as those explained in FIGS. 17A to 25B.

In the first embodiment explained above, MC1 in the first layer includes the diode DI in the PIN type from the bottom, and MC2 in the second layer includes the diode DI in the NIP type from the bottom. Alternatively, MC1 in the first layer may include the diode DI in the NIP type from the bottom, and MC2 in the second layer may include the diode DI in the PIN type from the bottom. In this case, wires below MC1 are word lines WL.

Second Embodiment

Configuration

Figure 26A:
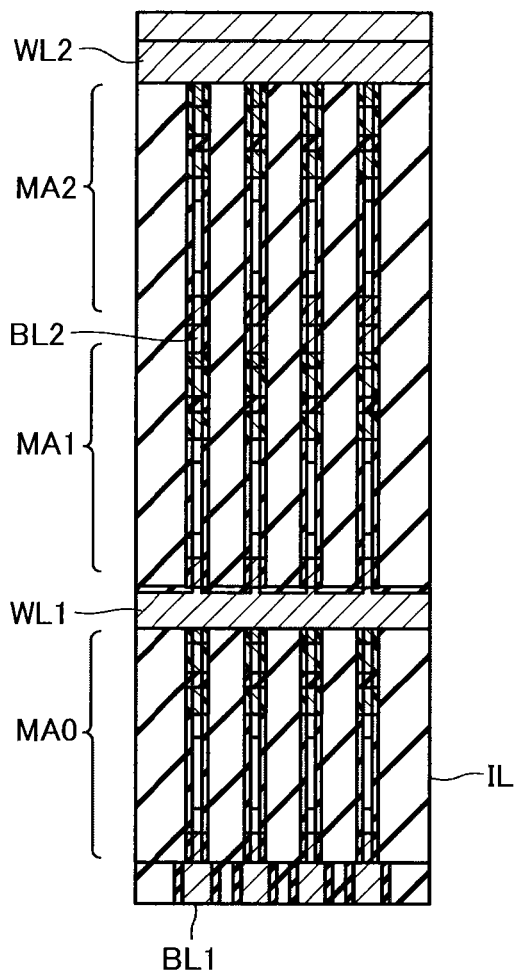
FIGS. 26A and 26B are cross sectional views of a memory cell array of a non-volatile semiconductor memory device according to a second embodiment.
Figure 26B:
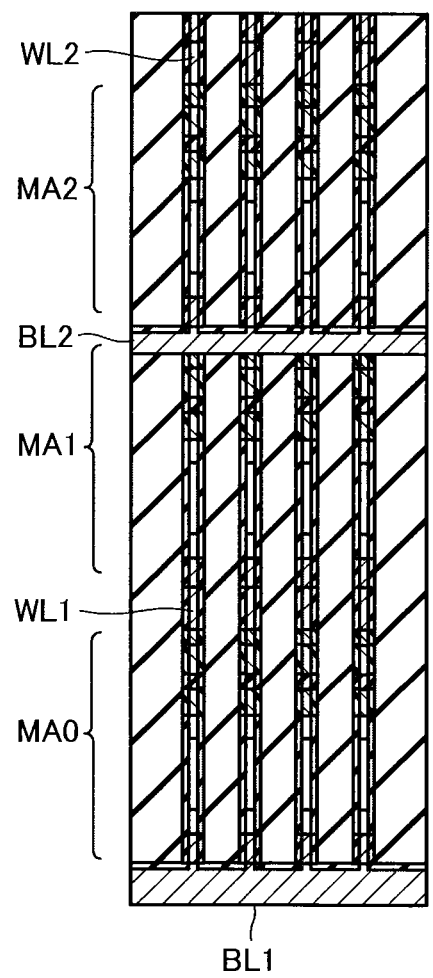

Subsequently, a configuration of a second embodiment will be explained with reference to FIGS. 26A to 27B. FIGS. 26A and 26B are cross sectional views of a memory cell array MA1 according to the present embodiment, in which A is a cross sectional view corresponding to B-B' in FIG. 16A, and B is a cross sectional view corresponding to C-C' in FIG. 16A. FIGS. 27A and 27B are enlarged cross sectional views of one memory cell MC. FIG. 27A is an enlarged cross sectional view viewed in a direction in which a bit line BL extends while FIG. 27B is an enlarged cross sectional view viewed in a direction in which a word line WL extends. A non-volatile semiconductor memory device according to the present embodiment is basically similar to the non-volatile semiconductor memory device according to the first embodiment but differs in that no barrier layer 114 is formed and in that a sidewall nitrided layer BLd, 104d, DId, 108d to 111d, and WLd contacts an inter-layer insulating layer IL.

A method of performing steam oxidation at the time of forming an inter-layer insulating layer is known. This method is effective in a case where a memory cell is formed at a relatively high aspect ratio (e.g., in a case where it is formed at an aspect ratio of 5 or higher). However, when steam oxidation is performed without protecting a pattern sidewall immediately after formation of a line-and-space pattern by etching, tungsten (W) constituting the bit line and the word line will be oxidized in an unusual manner, which causes a problem of an increase in wiring resistance.

To cope with this problem, in the first embodiment, the etched pattern is protected with the barrier layer 114 before steam oxidation.

In the present embodiment, unusual oxidation of the bit line BL and the word line WL at the time of steam oxidation is prevented by sidewall nitrided layers BLd and WLd. In the present embodiment as well, the bit line BL and the word line WL are made of tungsten (W). The sidewall nitrided layers BLd and WLd are made of tungsten nitride (WN) and have film thicknesses sufficient to enable protection of the bit line BL and the word line WL from unusual oxidation.

[Manufacturing Method]

Subsequently, with reference to FIGS. 28A to 38B, the manufacturing method of the semiconductor memory device according to the present embodiment will be explained. In FIGS. 28A to 30C, A is a plan view, B is a B-B' cross sectional view of A, and C is a C-C' cross sectional view of A. Also, in FIGS. 31A to 38B, A is a cross sectional view corresponding to B-B' in FIG. 30A, and B is a cross sectional view corresponding to C-C' in FIG. 30A. The manufacturing method of the non-volatile semiconductor memory device according to the present embodiment is basically similar to the first embodiment but differs in that film formation is performed so that the sidewall nitrided layers BLd and WLd may be so thick as to enable protection of the bit line BL and the word line WL from unusual oxidation and in that formation of the barrier layers 114 and 134 is omitted.

Figure 28A:
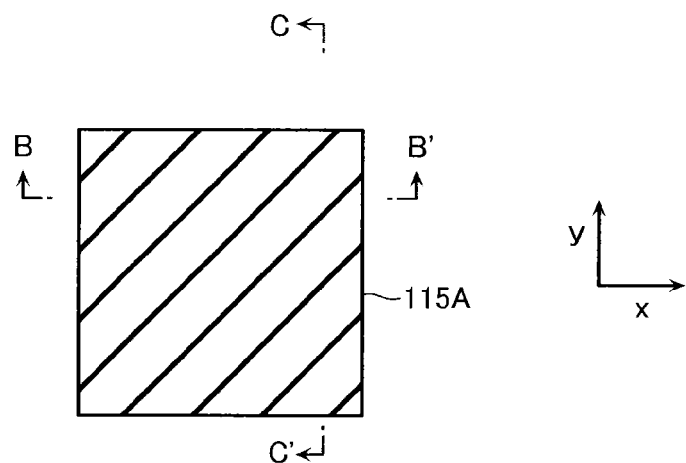
FIGS. 28A to 28C are cross sectional views illustrating a method for manufacturing the memory cell.
Figure 28B:
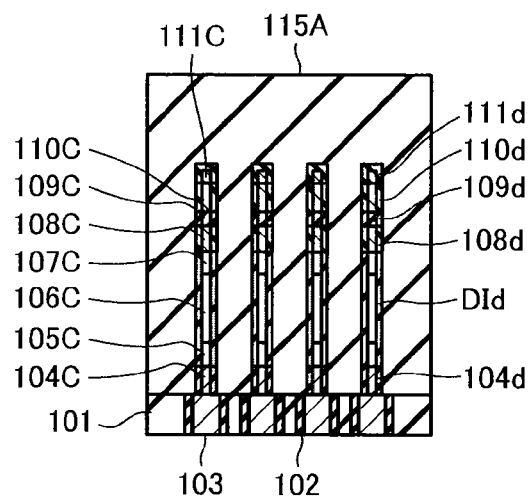
Figure 28C:
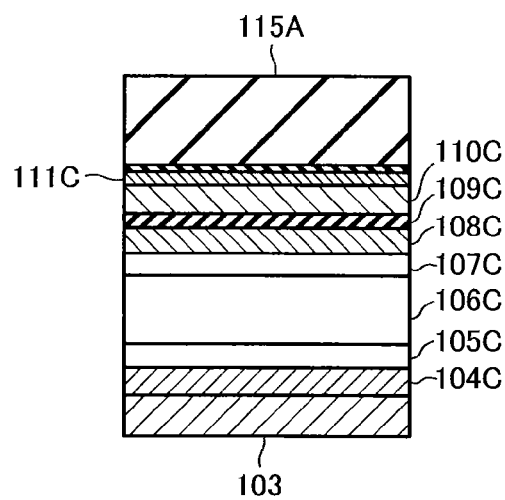
Figure 29A:
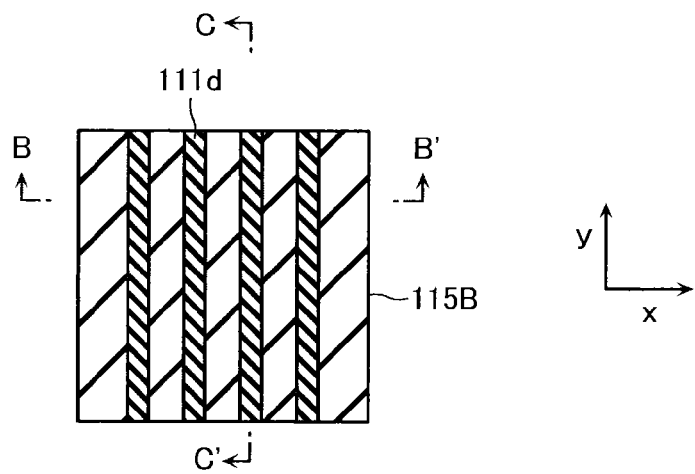
FIGS. 29A to 29C are cross sectional views illustrating the method for manufacturing the memory cell.
Figure 29B:
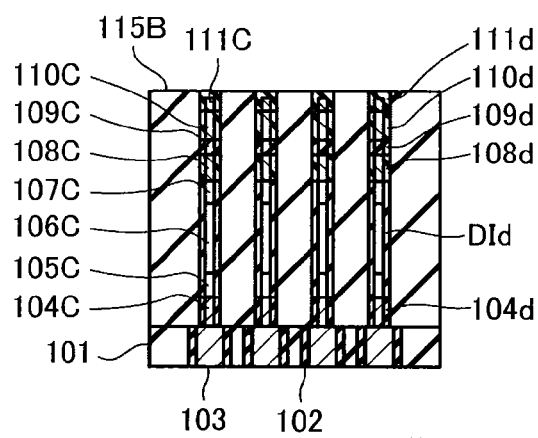
Figure 29C:
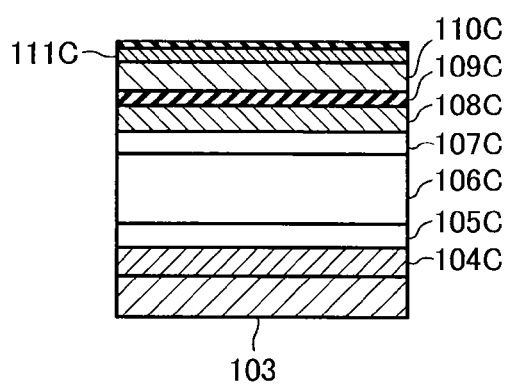
Figure 30A:
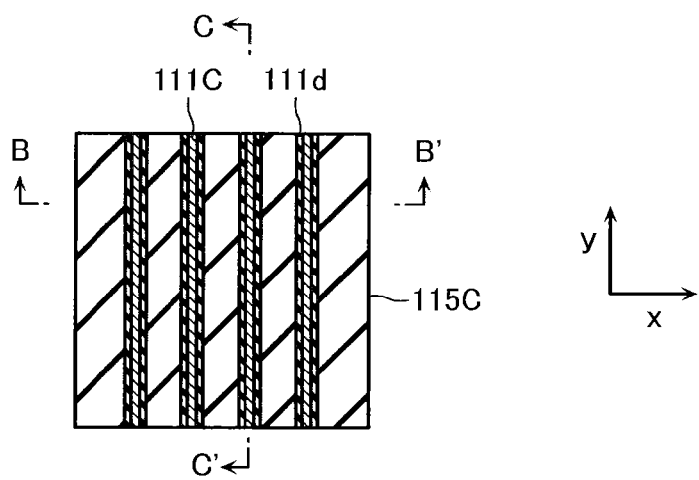
FIGS. 30A to 30C are cross sectional views illustrating the method for manufacturing the memory cell.
Figure 30B:
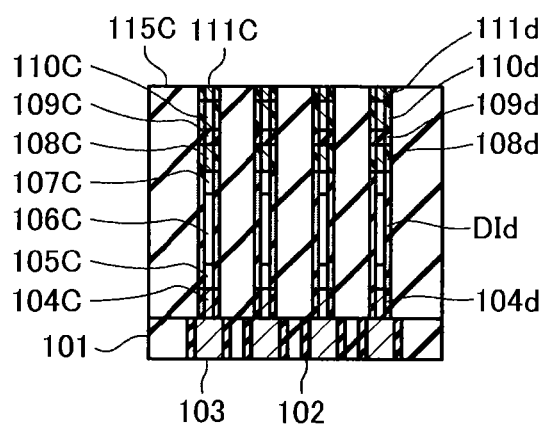
Figure 30C:
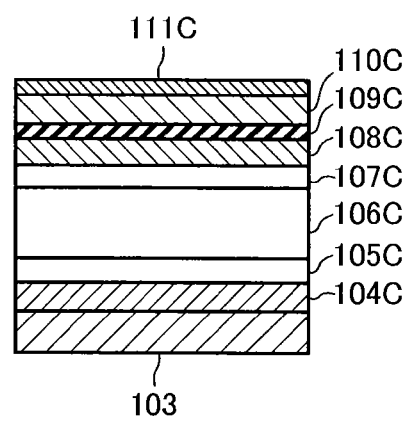

The manufacturing method of the non-volatile semiconductor memory device according to the present embodiment is similar to the first embodiment regarding a process shown in FIGS. 8A to 12C. Subsequently, as shown in FIGS. 28A to 28C, a pattern in which a sidewall nitrided layer is formed is filled with an inter-layer insulating layer 115A without forming a barrier layer 114, and steam oxidation is performed. However, if the inter-layer insulating layer 115A is not a coating layer, steam oxidation processing is not necessary. The inter layer insulating layer 115A may be poly-silazane. Thereafter, as shown in FIGS. 29A to 29C, the inter-layer insulating layer 115A is subjected to CMP until the sidewall nitrided layer 111$d$ is exposed, so that the inter-layer insulating layer 115B is formed. Subsequently, as shown in FIGS. 30A to 30C, the exposed sidewall nitrided layer 111$d$ as well as the inter-layer insulating layer 115B are removed by CMP until the conductive layer 111C is exposed, so that the inter-layer insulating layer 115C is formed.

Figure 31A:
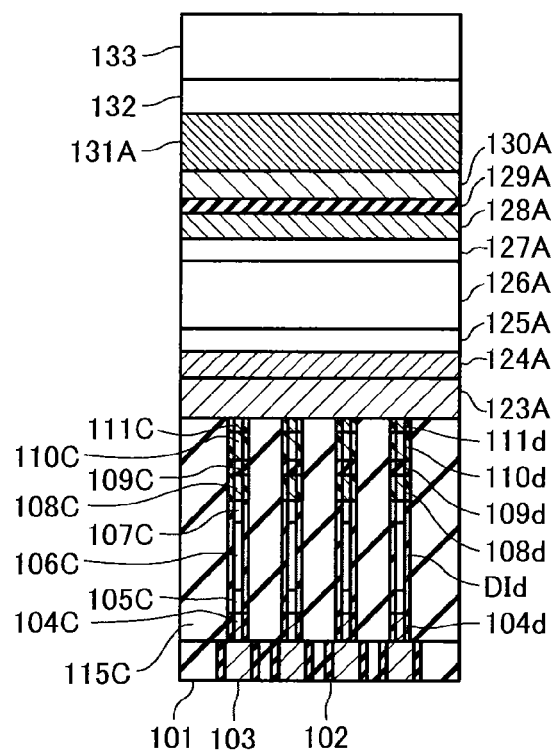
FIGS. 31A and 31B are cross sectional views illustrating the method for manufacturing the memory cell.
Figure 31B:
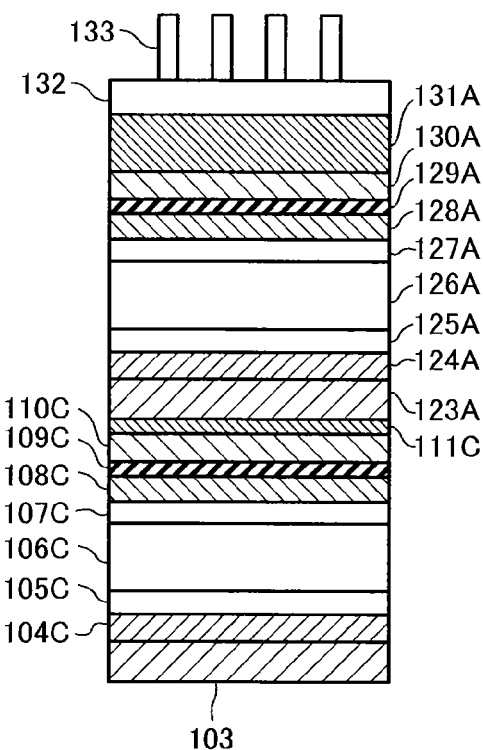

Subsequently, as shown in FIGS. 31A and 31B, a conductive layer 123A serving as a word line WL1, a conductive layer 124A serving as a first electrode 124, an n-type semiconductor layer 125A, an i-type semiconductor layer 126A, a p-type semiconductor layer 127A, a conductive layer 128A serving as a second electrode 128, a variable resistance layer 129A, a conductive layer 130A serving as a third electrode 130, a conductive layer 131A serving as a top electrode 131, an HM layer 132, and a resist pattern 133 are formed according to substantially the same steps as the steps shown in FIGS. 9A to 9C and FIGS. 10A to 10C. The materials for the conductive layer 124A to the HM layer 132A may be the materials used in the layers corresponding to the respective layers from the conductive layer 104A to the HM layer 112A. The resist pattern 133 is a line-and-space formed to be perpendicular to the bit lines BL within the xy plane. Similarly to the first embodiment, also in this embodiment, the semiconductor layers 125A-127A are formed so that a direction from the bit line BL to the word line WL via the memory cell MC is a forward direction of current.

Figure 32A:
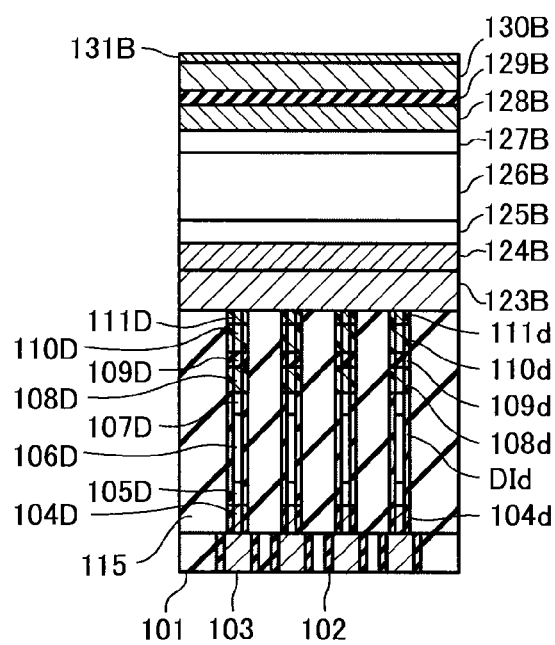
FIGS. 32A and 32B are cross sectional views illustrating the method for manufacturing the memory cell.
Figure 32B:
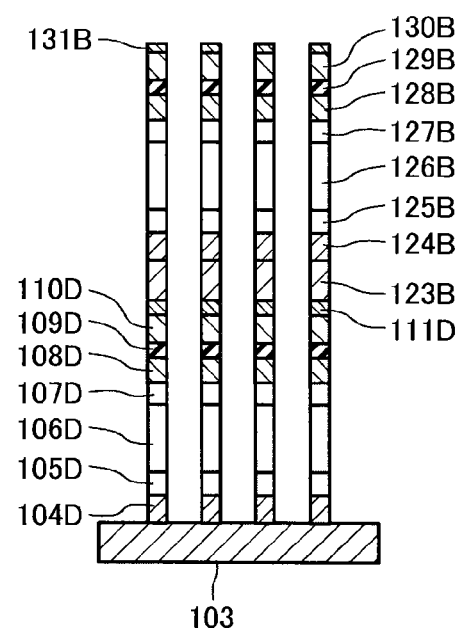

Subsequently, as shown in FIGS. 32A and 32B, etching process is performed according to substantially the same steps as those in FIGS. 11A to 11C to form a stacked layer structure. The stacked layer structure includes a word line (WL) 123, an electrode 124B, an n-type semiconductor layer 125B, an i-type semiconductor layer 126B, a p-type semiconductor layer 127B, a conductive layer 128B, a variable resistance layer 129B, a conductive layer 130B, a conductive layer 131B a conductive layer 104D, a p-type semiconductor layer 105D, an i-type semiconductor layer 106D, an n-type semiconductor layer 107D, a conductive layer 108D, a variable resistance layer 109D, a conductive layer 110D and a conductive layer 111D.

Figure 33A:
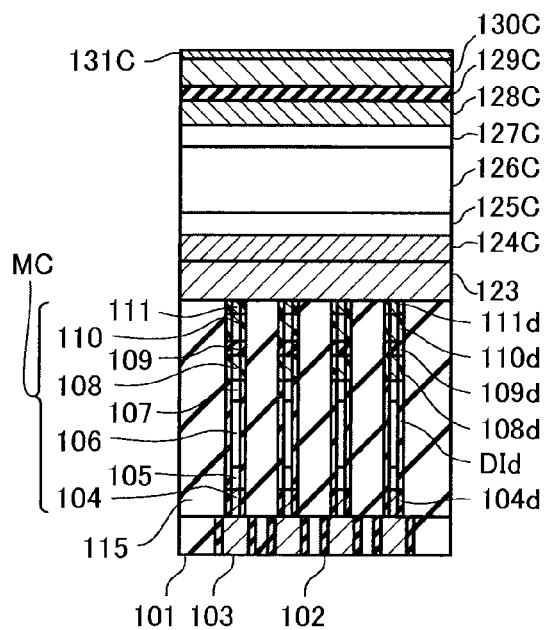
FIGS. 33A and 33B are cross sectional views illustrating the method for manufacturing the memory cell.
Figure 33B:
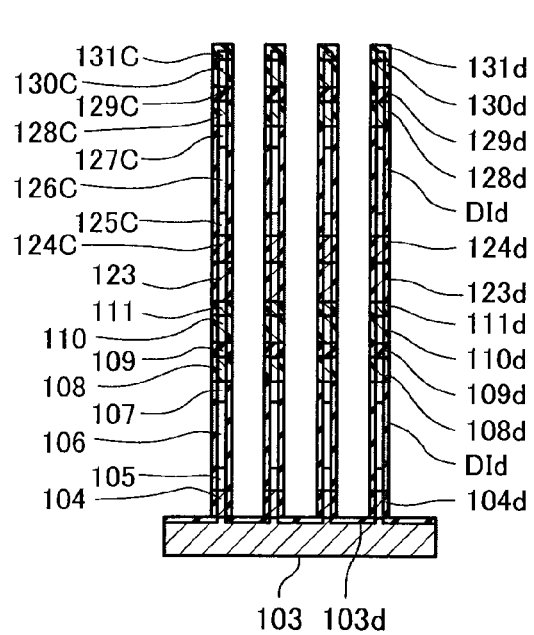

Subsequently, as shown in FIGS. 33A and 33B, the stacked layer structure formed undergoes plasma nitridation to form a first electrode 104, a p-type semiconductor layer 105, an i-type semiconductor layer 106, an n-type semiconductor layer 107, a second electrode 108, a variable resistance element 109, a third electrode 110, a top electrode 111, a word line 123 (WL1), a conductive layer 124C, an n-type semiconductor layer 125C, an i-type semiconductor layer 126C, a p-type semiconductor layer 127C, a conductive layer 128C, a variable resistance layer 129C, a conductive layer 130C, a conductive layer 131C, and a sidewall nitrided layer 104$d$, DId, 108$d$-111$d$, 123$d$, 124$d$, DId, and 128$d$-131$d$. By this process, a plurality of memory cells MC constituting a memory cell array layer MA0 are formed.

Figure 34A:
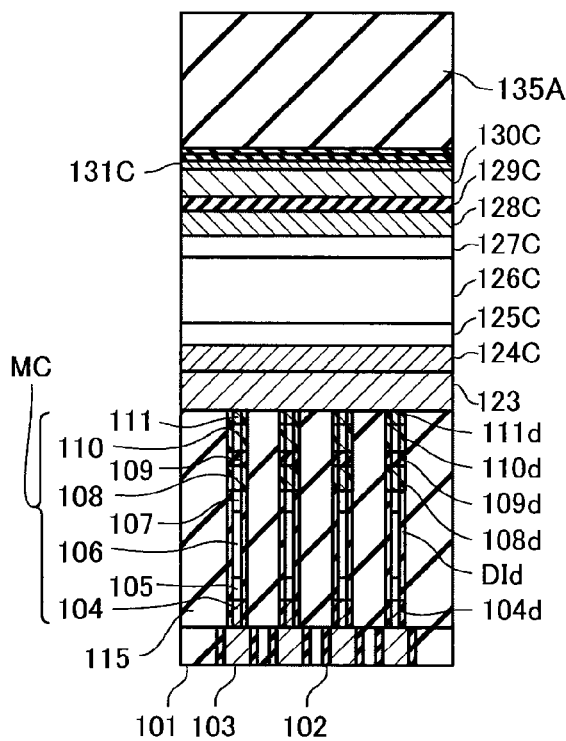
FIGS. 34A and 34B are cross sectional views illustrating the method for manufacturing the memory cell.
Figure 34B:
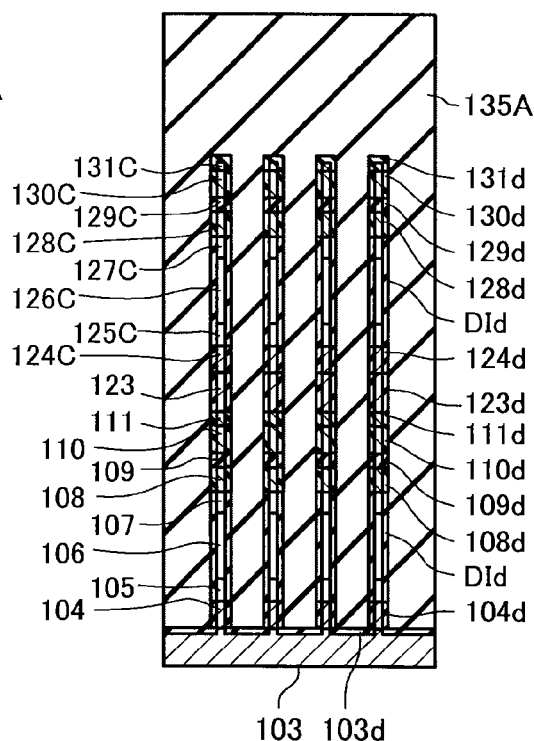
Figure 35A:
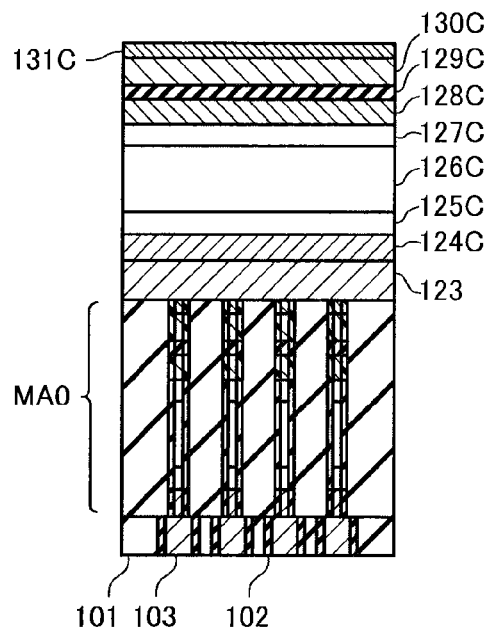
FIGS. 35A and 35B are cross sectional views illustrating the method for manufacturing the memory cell.
Figure 35B:
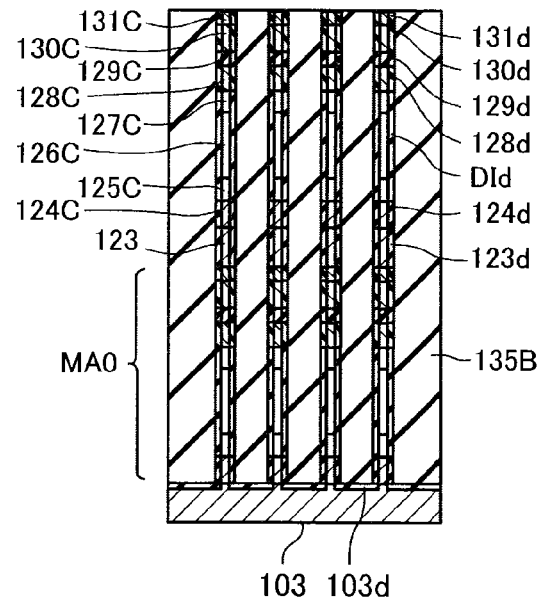
Figure 36A:
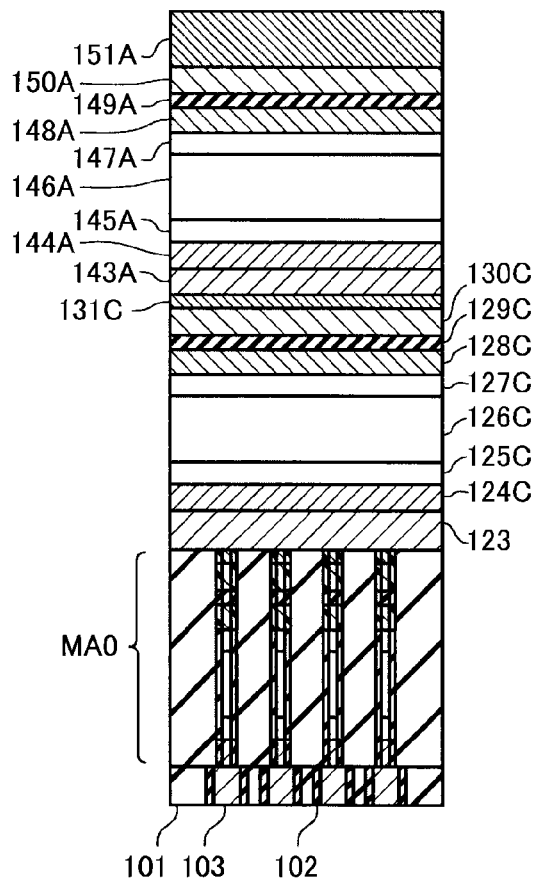
FIGS. 36A and 36B are cross sectional views illustrating the method for manufacturing the memory cell.
Figure 36B:
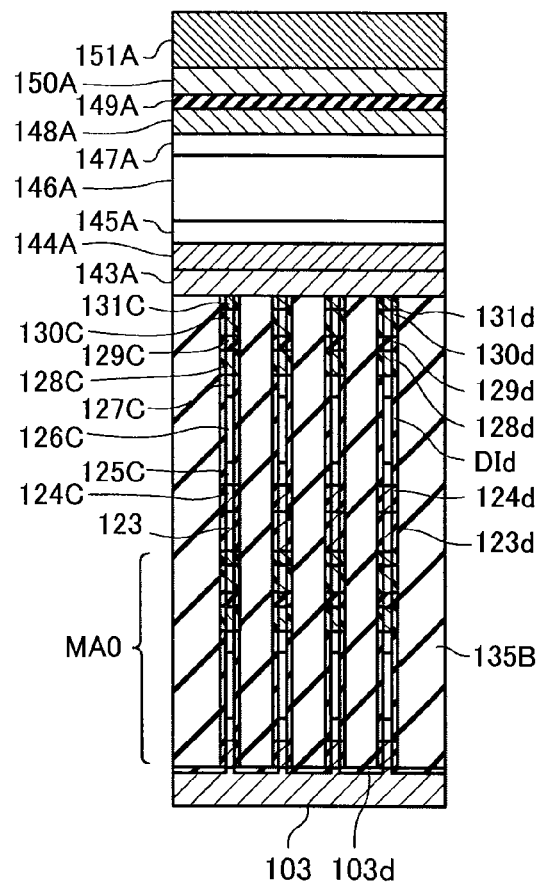

Subsequently, as shown in FIGS. 34A and 34B, an inter-layer insulating layer 135A is deposited, and steam oxidation is performed to form a memory cell array layer MA0. Note that if the inter-layer insulating layer 135A is not a coating layer, steam oxidation processing is not necessary. The same material as the material for inter layer insulating layer 115A can be used for the inter layer insulating layer 135A. Thereafter, as shown in FIGS. 35A and 35B, the inter-layer insulating layer 135A is subjected to CMP, and the conductive layer 131C is exposed, so that an inter-layer insulating layer 135B is formed. Subsequently, as shown in FIGS. 36A and 36B, a conductive layer 143A serving as a bit line BL2, a conductive layer 144A serving as a first electrode 144, a p-type semiconductor layer 145A, an i-type semiconductor layer 146A, an n-type semiconductor layer 147A, a conductive layer 148A serving as a second electrode 148, a variable resistance layer 149A serving as a variable resistance element 149, a conductive layer 150A serving as a third electrode 150, and a conductive layer 151A serving as a top electrode 151 are deposited thereon. The materials for the conductive layer 144A to the conductive layer 151A may be the materials used in the layers corresponding to the respective layers from the conductive layer 144A to the conductive layer 151A.

Figure 37A:
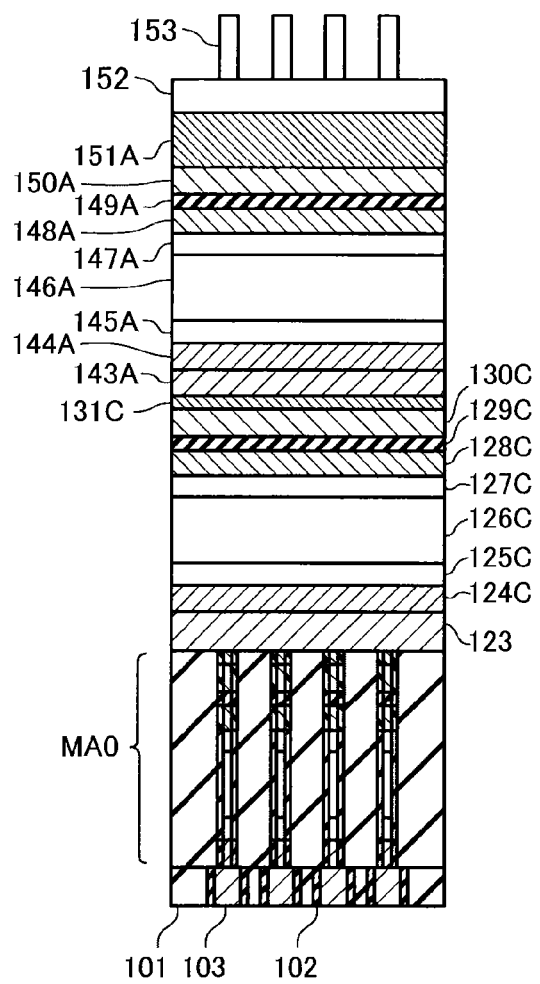
FIGS. 37A and 37B are cross sectional views illustrating the method for manufacturing the memory cell.
Figure 37B:
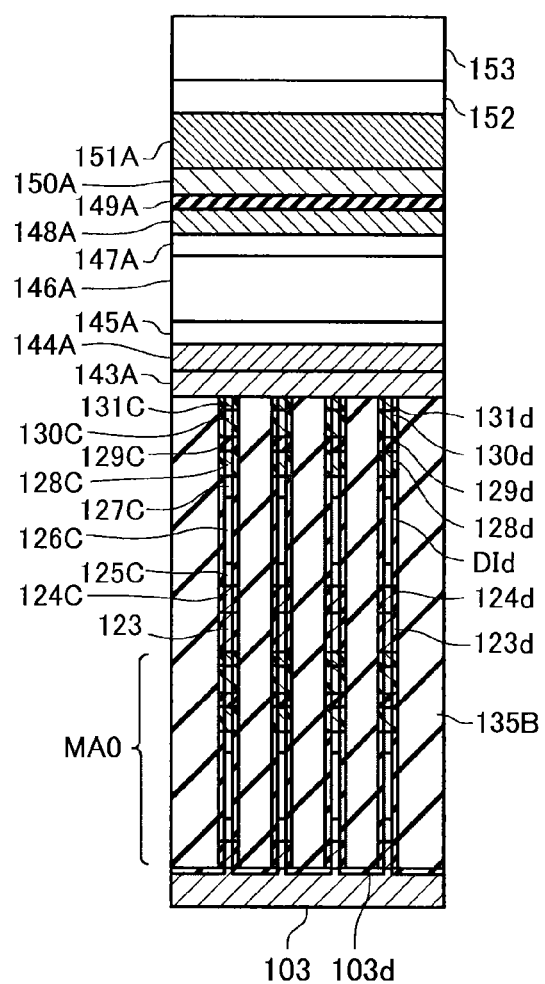

Thereafter, as shown in FIGS. 37A and 37B, an HM layer 152 and a resist pattern 153 are deposited. The resist pattern 153 is a line-and-space formed to be parallel to the bit lines BL. The HM layer 152 may be made of the same materials as the materials for the HM layer 132.

Figure 38A:
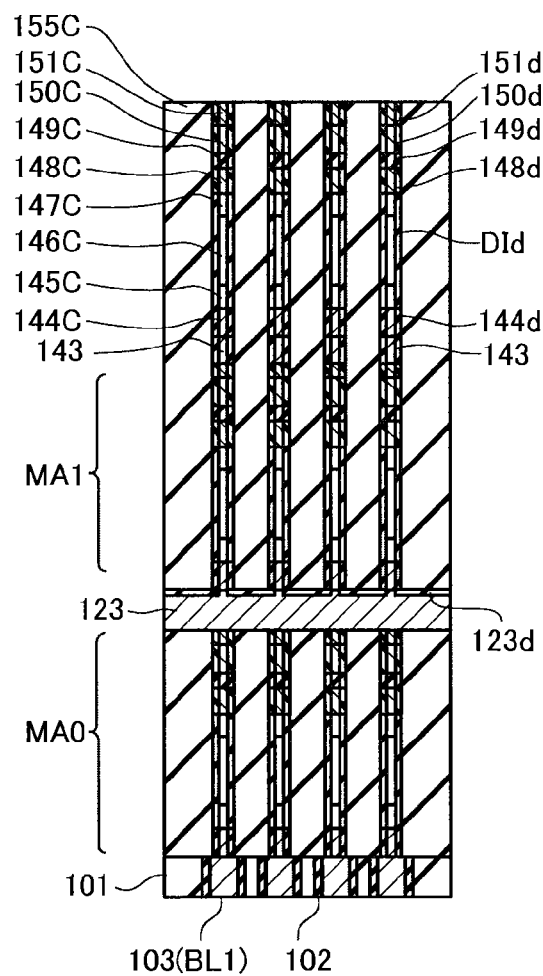
FIGS. 38A and 38B are cross sectional views illustrating the method for manufacturing the memory cell.
Figure 38B:
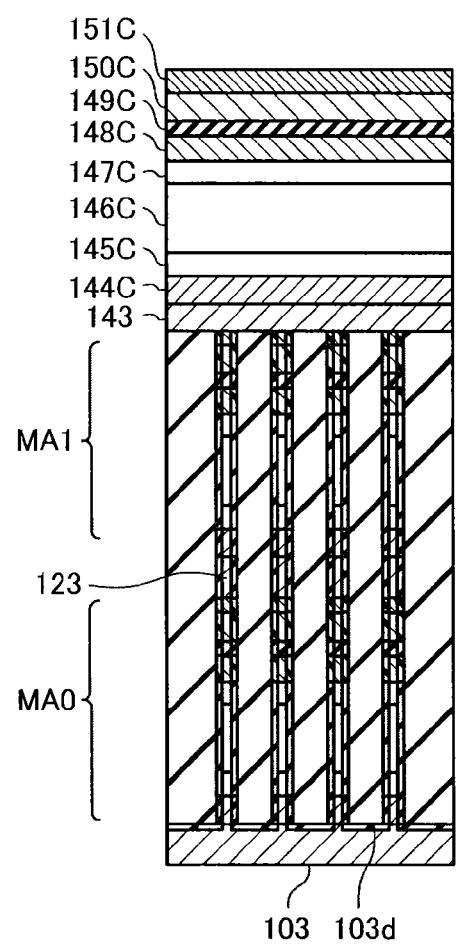

Thereafter, as shown in FIGS. 38A and 38B, etching is performed according to the same steps as those explained in FIGS. 32A to 36C, plasma nitridation to a pattern formed by the etching is performed, and an inter-layer insulating layer is deposited. Accordingly, an inter-layer insulating layer 155C is formed by CMP. Hereinafter, a memory cell array 1 having a stacked layer structure is formed on the basis of the same steps as those explained in FIGS. 32A to 38B.

In the second embodiment explained above, similarly to the first embodiment, MC1 in the first layer includes the diode DI in the PIN type from the bottom, and MC2 in the second layer includes the diode DI in the NIP type from the bottom. Alternatively, MC1 in the first layer may include the diode DI in the NIP type from the bottom, and MC2 in the second layer may include the diode DI in the PIN type from the bottom. In this case, wires below MC1 are word lines WL.

Third Embodiment

Configuration

Figure 39A:
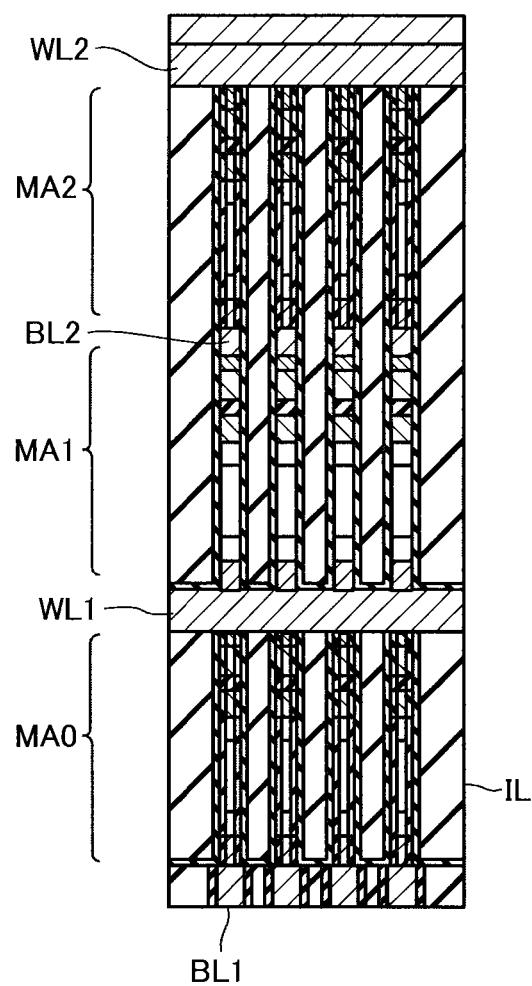
FIGS. 39A and 39B are cross sectional views of a memory cell array of a non-volatile semiconductor memory device according to a third embodiment.
Figure 39B:
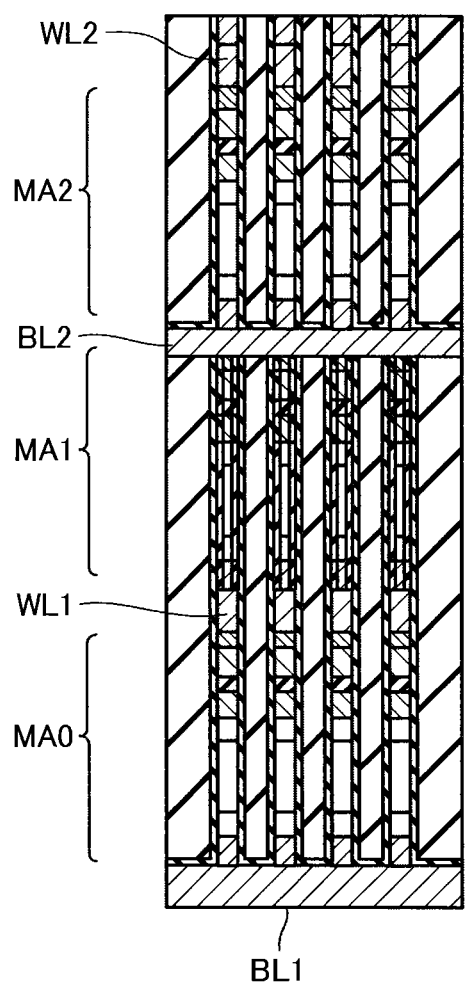

Subsequently, a configuration of a third embodiment will be explained with reference to FIG. 39A and FIG. 39B. FIG. 39A and FIG. 39B are cross sectional views of a memory cell array MA1 according to the present embodiment, in which FIG. 39A is a cross sectional view corresponding to B-B' in FIG. 16A, and FIG. 39B is a cross sectional view corresponding to C-C' in FIG. 16A. A non-volatile semiconductor memory device according to the present embodiment is basically similar to the non-volatile semiconductor memory device according to the first embodiment but differs in that sidewall nitrided layers WLd and BLd are not formed on the sidewalls of the word lines WL1, WL2 and the bit lines BL2, and side surfaces of the word lines WL1, WL2 and the bit lines BL2 contact the barrier layer 114. In this embodiment, as the side surfaces of the word lines WL and the bit lines BL are not nitrided, electric resistance of the word lines WL and the bit lines BL can be decreased. Additionally, in this embodiment, although only 2 side surfaces in the 4 side surfaces of the current rectifying element DI are nitrided, degradation of the current rectifying characteristics of the current rectifying element DI is suppressed, and the leak current can be sufficiently decreased.

[Manufacturing Method]

Subsequently, with reference to FIGS. 40A to 48B, the manufacturing method of the semiconductor memory device according to the present embodiment will be explained. "A"-numbered figures (FIGS. 40A to 48A) are cross sectional views corresponding to B-B' in FIG. 16A, and "B"-numbered figures (FIGS. 40B to 48B) are cross sectional views corresponding to C-C' in FIG. 16A. In the first embodiment and the second embodiment, in order to nitride the sidewalls of the word lines WL and of the bit lines BL, the nitridation is performed after the etching to the 2 memory cell array layers. However, in this embodiment, before the nitridation, the etching is performed to 1 memory cell array until right before the word lines WL and the bit lines BL are formed, and one more memory cell array layer is etched after the nitridation.

The manufacturing method of the non-volatile semiconductor memory device according to the present embodiment is similar to the first embodiment regarding a process shown in FIGS. 8A to 17C. In this embodiment, etching is performed to a part of a structure shown in FIGS. 17A to 17C corresponding to 1 memory cell array. The etching is performed until the conductive layer 123A is exposed to form stacked layer structures including the electrode 124B, an n-type semiconductor layer 125B, an i-type semiconductor layer 126B, a p-type semiconductor layer 127B, a conductive layer 128B, a variable resistance layer 129B, a conductive layer 130B and a conductive layer 131B.

Subsequently, as shown in FIGS. 41A and 41B, the sidewall of the stacked layer structure formed is nitrided by plasma nitridation to form a sidewall nitrided layer 123d on the upper surface of the conductive layer 123A and form a sidewall nitrided layer 124d, DId, and 128d-131d on the sidewalls of a conductive layer 124C, an n-type semiconductor layer 125C, an i-type semiconductor layer 126C, a p-type semiconductor layer 127C, a conductive layer 128C, a variable resistance layer 129C, a conductive layer 130C, and a conductive layer 131C.

Figure 42A:
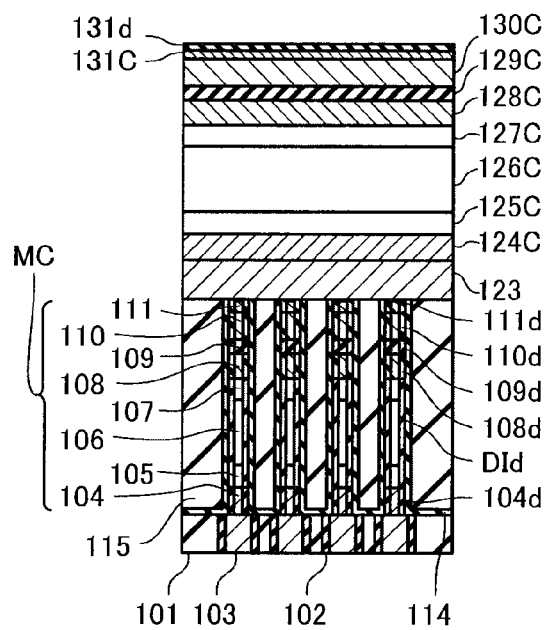
FIGS. 42A and 42B are cross sectional views illustrating the method for manufacturing the memory cell.
Figure 42B:
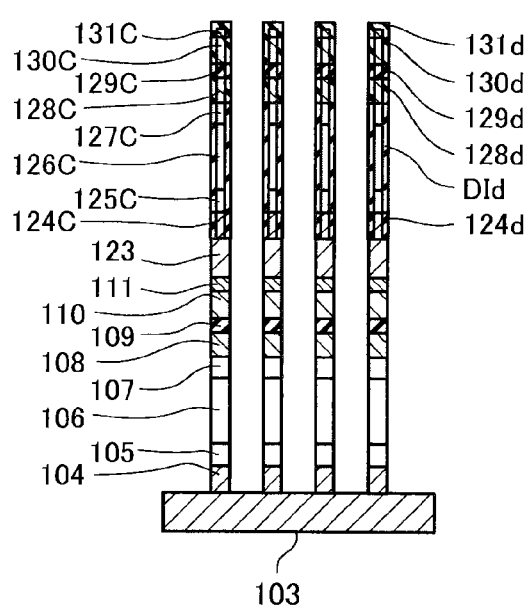

Subsequently, as shown in FIGS. 42A and 42B, an etching is performed until the bit line 103 is exposed to form the word lines 123, the top electrodes 111, the third electrodes 110, the variable resistance elements 109, the second electrodes 108, the current rectifying elements DI, and the first electrodes 104. By this process, a plurality of the memory cells MC constituting the memory cell array layer MA0 is formed.

Figure 43A:
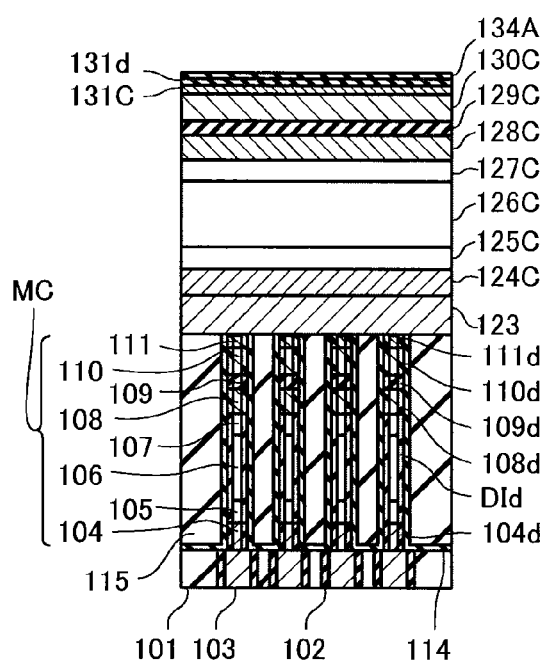
FIGS. 43A and 43B are cross sectional views illustrating the method for manufacturing the memory cell.
Figure 43B:
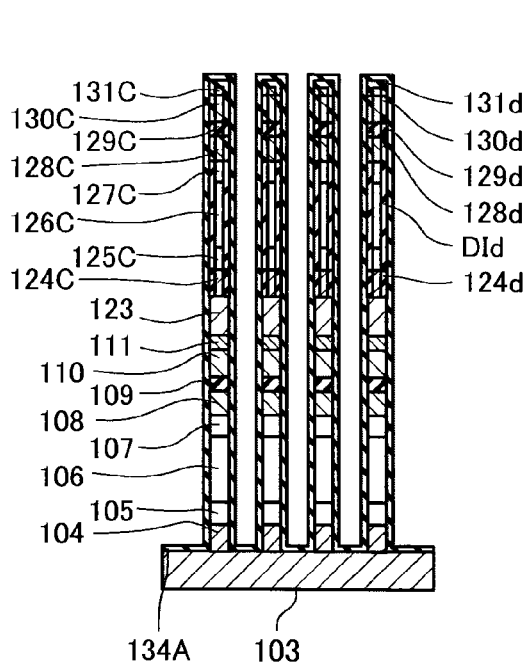

Subsequently, as shown in FIGS. 43A and 43B, an insulating layer 134A serving as a barrier layer 134 is formed to cover the upper surface of the bit lines 103, sidewalls of the memory cells MC and the word lines 123, sidewalls of the sidewall nitrided layers 124d to 131d and the upper surfaces of the sidewall nitrided layer 131d. The same material as the material for the insulating layer 114 can be used for the insulating layer 134A.

Figure 44A:
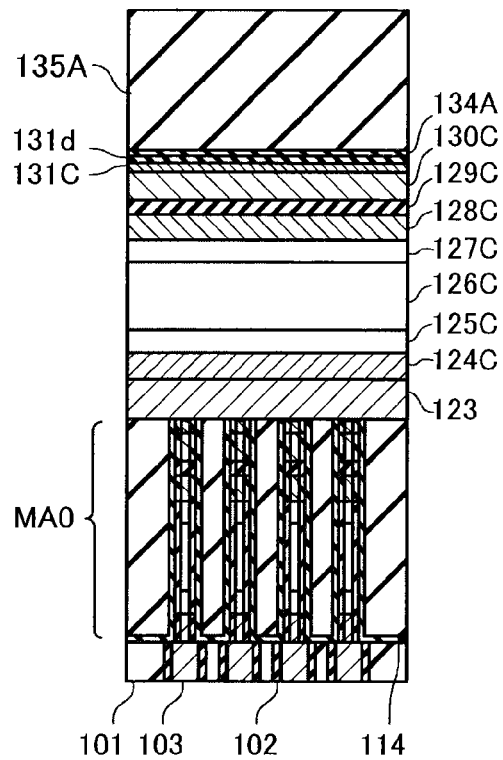
FIGS. 44A and 44B are cross sectional views illustrating the method for manufacturing the memory cell.
Figure 44B:
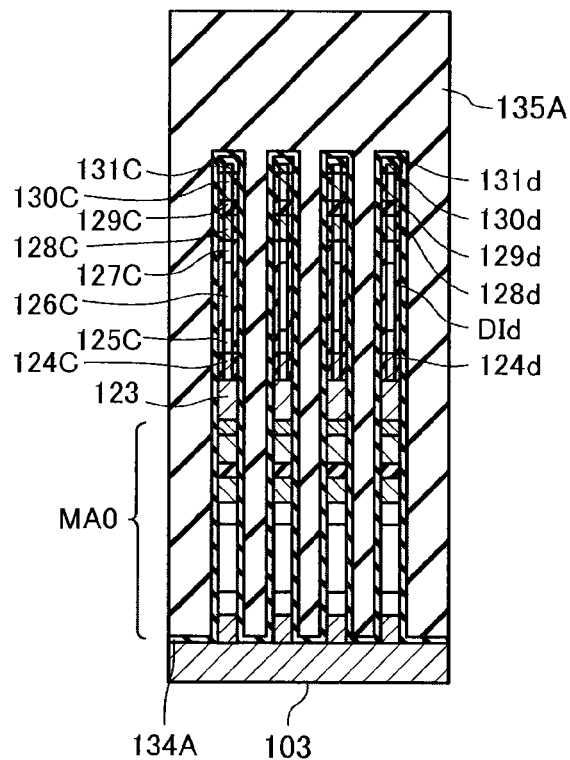
Figure 45A:
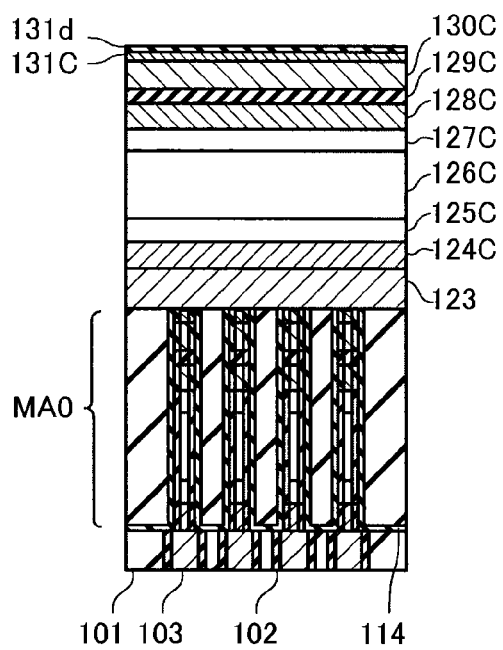
FIGS. 45A and 45B are cross sectional views illustrating the method for manufacturing the memory cell.
Figure 45B:
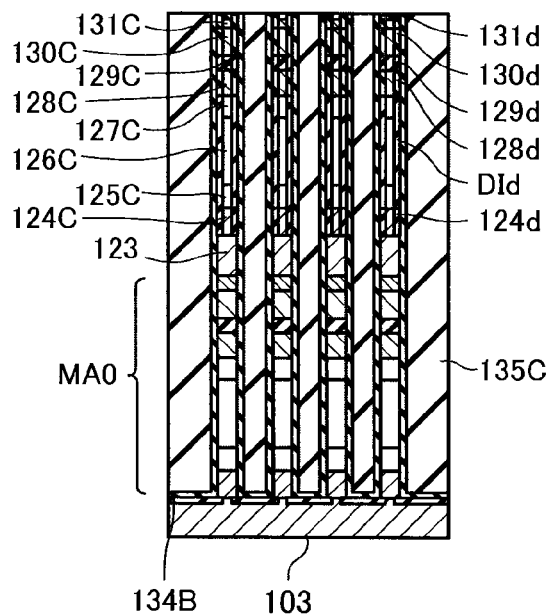

Subsequently, as shown in FIGS. 44A and 44B, an inter-layer insulating layer 135A is deposited, and steam oxidation is performed to form a memory cell array layer MA0. Note that if the inter-layer insulating layer 135A is not a coating layer, steam oxidation processing is not necessary. The same material as the material for the inter layer insulating layer 115A can be used for the inter layer insulating layer 135A. Thereafter, as shown in FIGS. 45A and 45B, the inter-layer insulating layer 135A and the insulating layer 134A are subjected to CMP, and the conductive layers 131C are exposed, so that inter-layer insulating layers 135C and the insulating layers 135B are formed. Subsequently, as shown in FIGS. 46A and 46B, a conductive layer 143A serving as a bit line BL2, a conductive layer 144A serving as a first electrode 144, a p-type semiconductor layer 145A, an i-type semiconductor layer 146A, an n-type semiconductor layer 147A, a conductive layer 148A serving as a second electrode 148, a variable resistance layer 149A serving as a variable resistance element 149, a conductive layer 150A serving as a third electrode 150, and a conductive layer 151A serving as a top electrode 151 are deposited on the exposed conductive layers 131C. The materials for the conductive layer 144A to the conductive layer 151A may be the materials used in the layers corresponding to the respective layers from the conductive layer 144A to the conductive layer 151A.

Figure 47A:
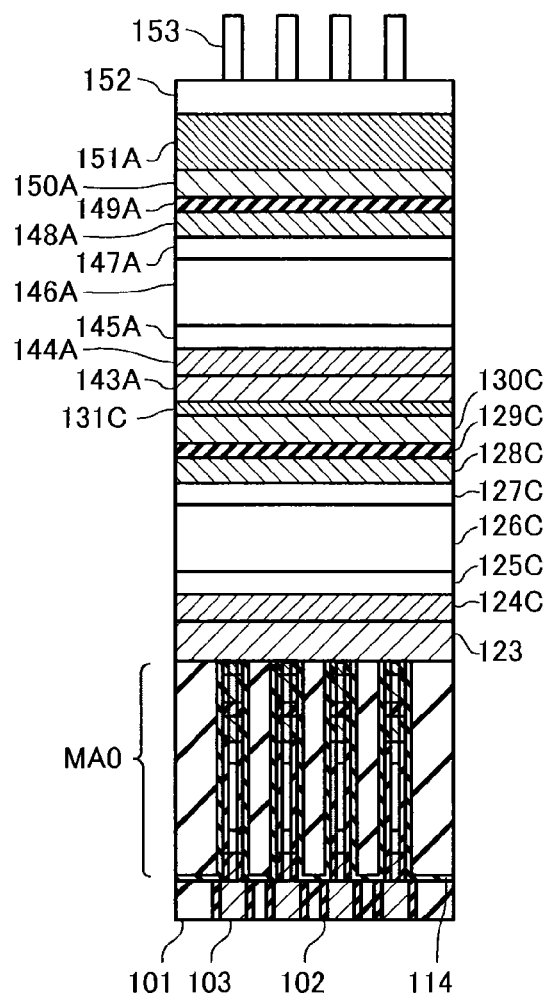
FIGS. 47A and 47B are cross sectional views illustrating the method for manufacturing the memory cell.
Figure 47B:
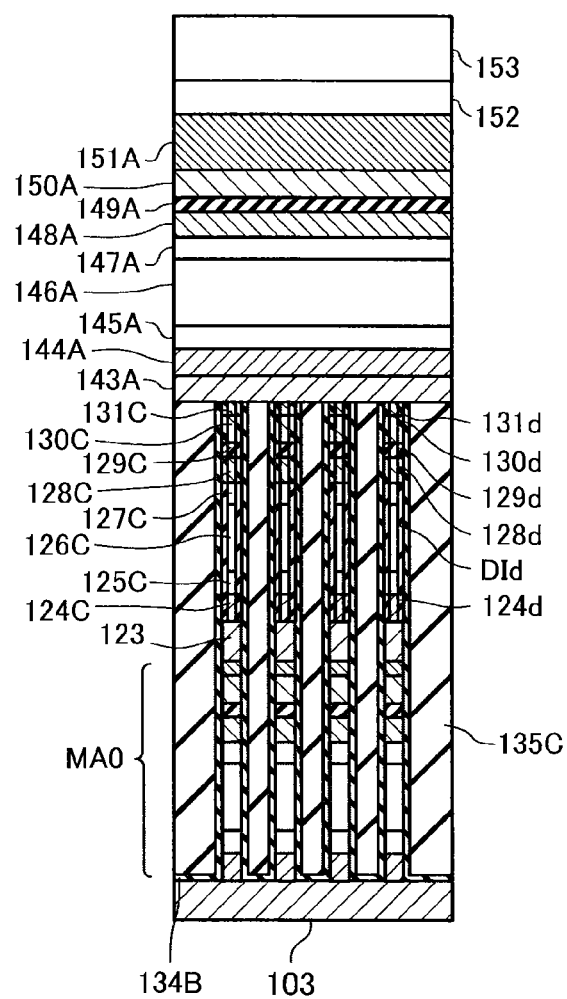

Thereafter, as shown in FIGS. 47A and 47B, an HM layer 152 and a resist pattern 153 are deposited. The resist pattern 153 is a line-and-space formed to be parallel to the bit lines BL. The HM layer 152 may be made of the same materials as the materials for the HM layer 132.

Figure 48A:
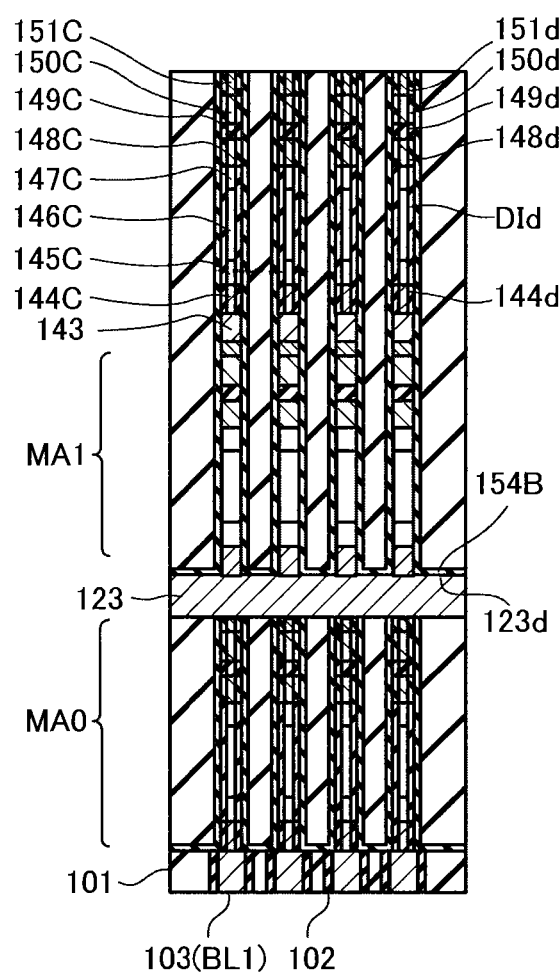
FIGS. 48A and 48B are cross sectional views illustrating the method for manufacturing the memory cell.
Figure 48B:
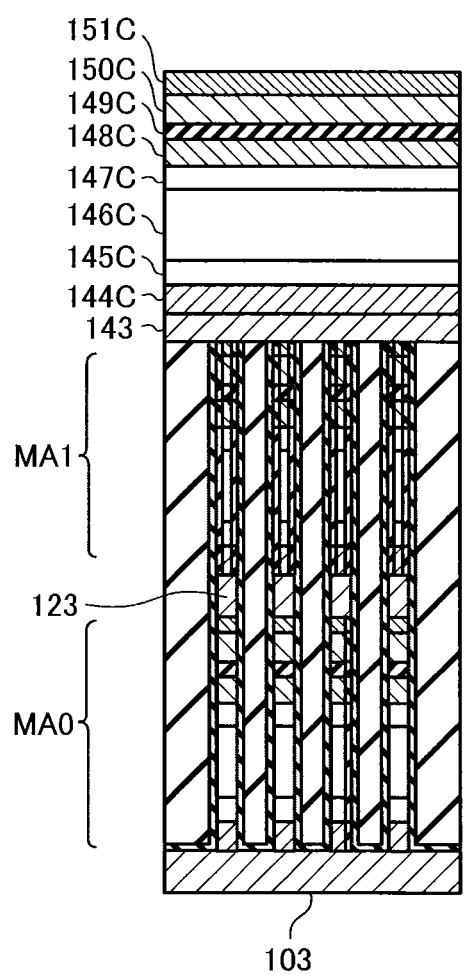

Thereafter, as shown in FIGS. 48A and 48B, according to the same steps as those explained in FIGS. 40A to 45B, etching is performed so that the sidewalls of the bit lines 143 are not exposed, plasma nitridation to a pattern formed by the etching is performed, etching to the part corresponding to the bit lines 143 and the memory cell array layer MA1 is performed, a barrier layer and an inter-layer insulating layer are deposited, and an insulating layer 154B and an inter-layer insulating layer 155C are formed by CMP. Hereinafter, a memory cell array 1 having a stacked layer structure is formed on the basis of the same steps as those explained in FIGS. 17A and 17B, and FIGS. 40A to 48B. Note that a polarity of the current rectifying elements DI can be arbitrarily selected.

Fourth Embodiment

Subsequently, a configuration of a fourth embodiment will be explained with reference to FIG. 49A and FIG. 49B. FIG. 49A and FIG. 49B are cross sectional views of a memory cell array MA1 according to the present embodiment, in which FIG. 49A is a cross sectional view corresponding to B-B' in FIG. 16A, and FIG. 49B is a cross sectional view corresponding to C-C' in FIG. 16A. A non-volatile semiconductor memory device according to the present embodiment is basically similar to the non-volatile semiconductor memory device according to the third embodiment but differs in that the non-volatile semiconductor memory device according to this embodiment comprises orientation-cancelling films WLc and BLc respectively formed on the lower surfaces of the word lines WL1, WL2 and of the bit lines BL2 which cancel the effect from a crystal structure of the lower layer to the orientation of word lines WL1, WL2, and bit lines BL2. The orientation-cancelling films WLc and BLc can be made of Si, WN and so on. As the non-volatile semiconductor memory device according to this embodiment comprises the orientation-cancelling film WLc and BLc, resistivity in the word lines WL and the bit lines BL can be decreased, so that wiring resistances are further decreased compared to the third embodiment.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising a cell array layer including a first wire, one or more memory cells stacked on the first wire, and a second wire formed on the memory cell so as to cross the first wire, wherein
the memory cell includes a current rectifying element and a variable resistance element,
the current rectifying element is connected to the first wire via a first electrode,
the variable resistance element is connected to the current rectifying element via a second electrode and is connected to the second wire via a third electrode,
the current rectifying element, the variable resistance element, and the first to third electrodes are each provided with a sidewall nitrided layer on a side surface thereof,
each sidewall nitrided layer provided on the side surface of the respective current rectifying element, the variable resistance element, and the first to third electrodes includes nitrogen and an atom included by the respective current rectifying element, the variable resistance element, and the first to third electrodes, and
an atomic composition ratio of nitrogen is higher than that of oxygen in a part of a sidewall of the current rectifying element.

2. The non-volatile semiconductor memory device according to claim 1, wherein
thicknesses of the sidewall nitrided layers are 2-5 nm.

3. The non-volatile semiconductor memory device according to claim 1, further comprising:
an inter-layer insulating layer providing insulation between the memory cells; and
a barrier layer formed between the sidewall nitrided layer and the inter-layer insulating layer.

4. The non-volatile semiconductor memory device according to claim 2, further comprising:
an inter-layer insulating layer providing insulation between the memory cells and contacting the side surface of the sidewall nitrided layer.

5. The non-volatile semiconductor memory device according to claim 1,
wherein sidewall nitrided layers are formed on the side surfaces of the first wire and the second wire respectively.

6. The non-volatile semiconductor memory device according to claim 1, further comprising
an inter-layer insulating layer providing insulation between the memory cells; and
barrier layers formed between the first wire and the inter-layer insulating layer and formed between the second wire and the inter-layer insulating layer.

7. The non-volatile semiconductor memory device according to claim 1, further comprising
an orientation-cancelling film formed at least on the lower surface of the first wire or the second wire.

8. A non-volatile semiconductor memory device comprising a cell array layer including a first wire, one or more memory cells stacked on the first wire, and a second wire formed on the memory cell so as to cross the first wire,
the memory cell including a current rectifying element and a variable resistance element,
the current rectifying element being connected to the first wire via a first electrode,
the variable resistance element being connected to the current rectifying element via a second electrode and being connected to the second wire via a third electrode,
the current rectifying element, the variable resistance element, and the first to third electrodes being provided on a side surface thereof with a sidewall nitrided layer, and
each sidewall nitrided layer provided on the side surface of the respective current rectifying element, the variable resistance element, and the first to third electrodes including nitrogen and an atom included by the respective current rectifying element, the variable resistance element, and the first to third electrodes.

9. The non-volatile semiconductor memory device according to claim 8, further comprising:
an inter-layer insulating layer providing insulation between the memory cells; and
a barrier layer formed between the sidewall nitrided layer and the inter-layer insulating layer.

10. The non-volatile semiconductor memory device according to claim 8, further comprising:
an inter-layer insulating layer providing insulation between the memory cells and contacting the side surface of the sidewall nitrided layer.

11. The non-volatile semiconductor memory device according to claim 8,
wherein sidewall nitrided layers are formed on the side surfaces of the first wire and the second wire respectively.

12. The non-volatile semiconductor memory device according to claim 8, further comprising
an inter-layer insulating layer providing insulation between the memory cells; and
barrier layers formed between the first wire and the inter-layer insulating layer and formed between the second wire and the inter-layer insulating layer.

13. The non-volatile semiconductor memory device according to claim 8, further comprising
an orientation-cancelling film formed at least on the lower surface of the first wire or the second wire.

* * * * *